United States Patent [19]

Hyatt

[11] Patent Number: 4,531,182

[45] Date of Patent: Jul. 23, 1985

[54] MACHINE CONTROL SYSTEM OPERATING FROM REMOTE COMMANDS

[76] Inventor: Gilbert P. Hyatt, 11101 Amigo Ave., Northridge, Calif. 91324

[21] Appl. No.: 230,872

[22] Filed: Mar. 1, 1972

Related U.S. Application Data

[63] Continuation-in-part of Ser. No. 229,213, Apr. 13, 1972, Pat. No. 3,820,894, Ser. No. 135,040, Apr. 19, 1971, , Ser. No. 134,958, Apr. 19, 1971, , Ser. No. 101,881, Dec. 28, 1970, , and Ser. No. 879,293, Nov. 24, 1969, abandoned.

[51] Int. Cl.³ ............................................. G06F 15/46
[52] U.S. Cl. .................................... 364/131; 364/167
[58] Field of Search .............. 340/172.5; 235/151.11; 364/474, 107, 475, 130-136, 137, 138, 167-171, 188, 189, 200 MS File, 900 MS File

[56] References Cited

U.S. PATENT DOCUMENTS

| | | | |
|---|---|---|---|
| 2,897,638 | 8/1959 | Maker | 364/474 X |
| 3,142,820 | 7/1964 | Daniels | 364/200 |
| 3,315,235 | 4/1967 | Carnevale et al. | 340/172.5 |
| 3,462,742 | 8/1969 | Miller et al. | 364/200 |
| 3,465,298 | 9/1969 | Duke et al. | 364/200 |
| 3,587,044 | 6/1971 | Jenkins | 364/200 |
| 3,626,385 | 12/1971 | Bouman | 340/172.5 |
| 3,634,662 | 1/1972 | Slawson | 235/151.11 |
| 3,668,653 | 6/1972 | Fair et al. | 340/172.5 |
| 3,686,639 | 8/1972 | Fletcher et al. | 340/172.5 |
| 3,699,317 | 10/1972 | Middleditch | 235/151.11 |
| 3,702,988 | 11/1972 | Haney et al. | 340/172.5 |
| 3,728,710 | 4/1973 | Berg | 340/172.5 X |

FOREIGN PATENT DOCUMENTS

1240882  7/1971  United Kingdom ................ 235/154

OTHER PUBLICATIONS

"Microprogrammable Digital Computer", by Micro Systems, Inc., Computer Design, May 1969, p. 69.
Boysel, "Adder on a Chip: LSI Helps Reduce Cost of Small Machine"—Electronics, Mar. 1968, pp. 119-124.
Hopkins—"Electronic Navigator Charts Man's Path to the Moon"—Electronics, Jan. 1967, pp. 109-118.
Levy—"System Utilization of LSI", IEEE, vol. EC-16, No. 5, Oct. 1967, pp. 562-566.
Beelitz et al.—"System Architecture for LSI"—AFIPS Conf. Proc., vol. 31, Nov. 14-16, 1967, pp. 185-200.
"Minicomputers-What All the Noise is About", by Lapidus in Control Engineering, pp. 73-80, Sep. 1968.
"Architecture of the IBM System/360", by Amdahl et al., Reprinted from IBM Journal of Research & Development, vol. 8, #2, 4-1964.
"The Computer Managed Manufacturing Concept", by Francis et al., Proceedings of the 7th Annual Meeting and Tech. Conf. of the NC Society, 4-10-70.
"Computerized NC-A Step Toward the Automated Factory", by Budzilovich, Control Engineering, Jul. 1969, pp. 62-68.
"Three Machine Tool Shows—Or Were They Control Show! It Was Hard to Tell", in Control Engineering, Nov. 1970; pp. 53-56.
"The Technical Ins and Outs of Computerized Numerical Control—A Special Report", in Control Engineering, Mar. 1971; pp. 65-84.

Primary Examiner—Joseph F. Ruggiero
Attorney, Agent, or Firm—Gilbert P. Hyatt

[57] ABSTRACT

A machine control system is provided, being connected to a remote source of machine commands. In a preferred embodiment, a computerized numerical control (CNC) system is provided for controlling a machine and is arranged for communication with a remote computer center for receiving parts program commands therefrom and for controlling a machine in response thereto. Multiple sources of parts program commands are provided including a tape reader source and an operator panel source of parts program commands. Parts program commands can be executed directly for control of a machine or can be stored in a parts program memory for buffering, editing, converting, assembling and other functions. Many numerical control features are provided with the CNC system of the present invention for enhanced capabilities.

33 Claims, 10 Drawing Figures

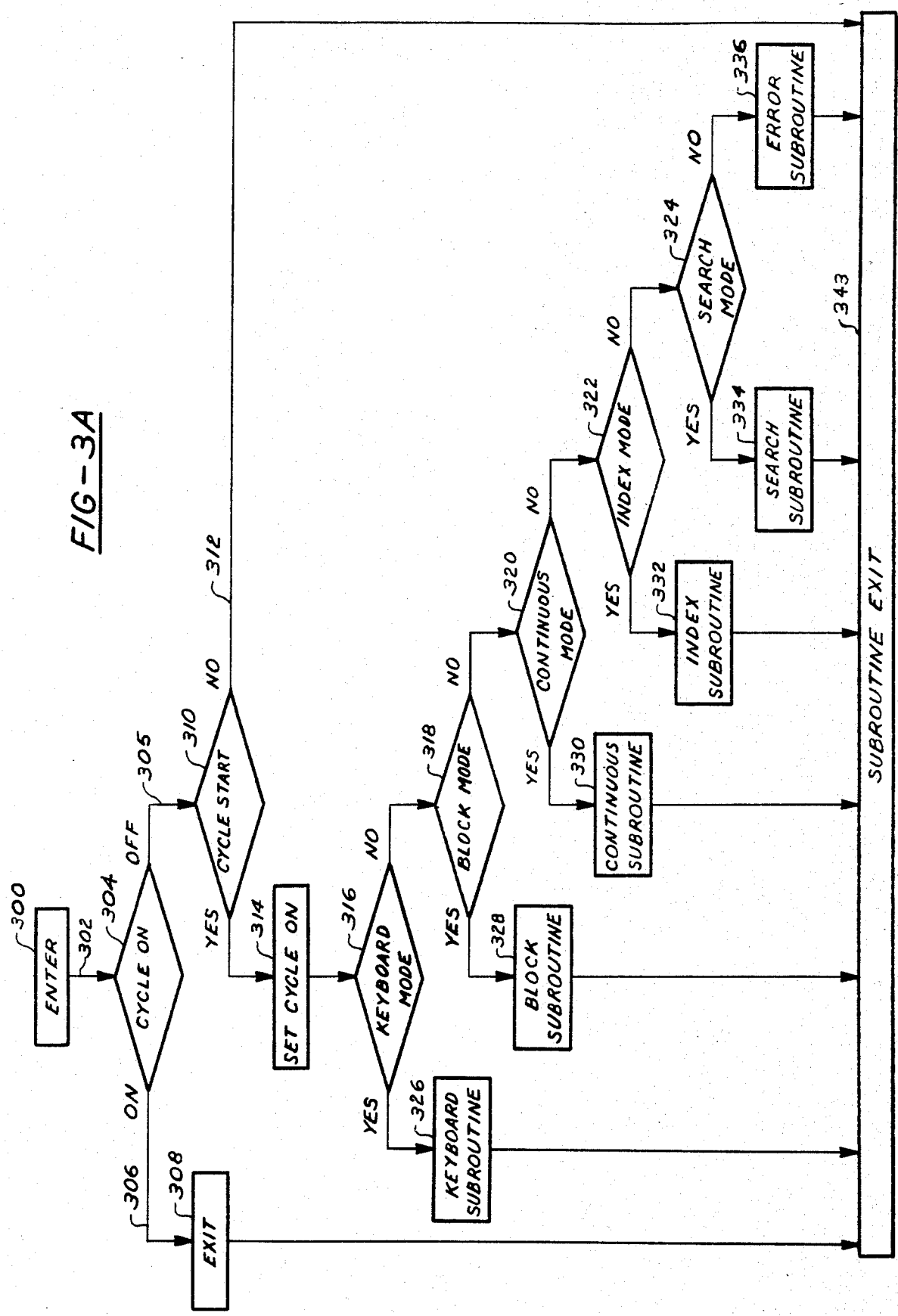

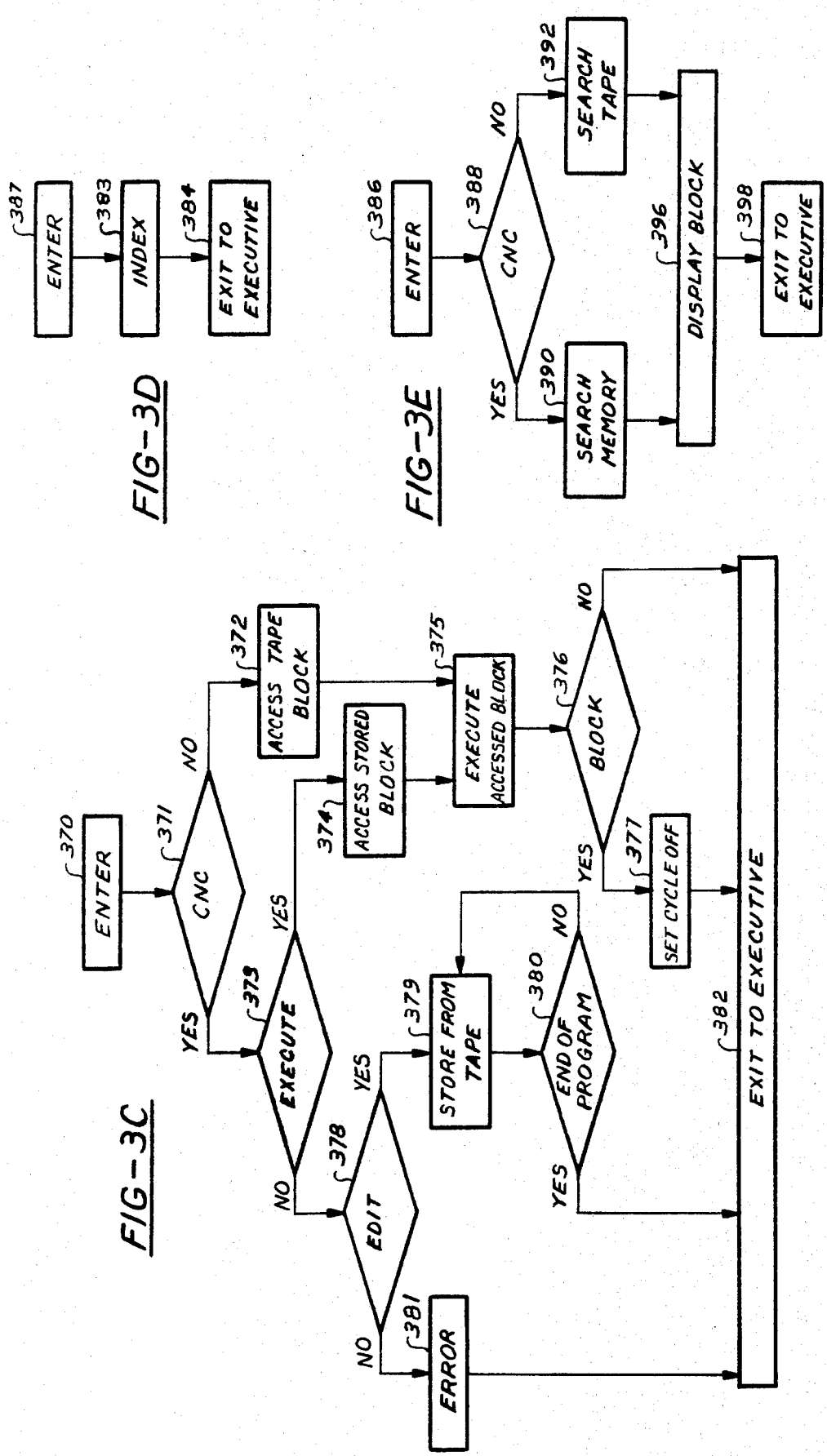

MACHINE CONTROL SYSTEM OPERATING FROM REMOTE COMMANDS

CROSS REFERENCE TO RELATED APPLICATIONS

This application is a continuation-in-part of the chain of parent applications having copendency therebetween:

1. Method and Apparatus for Processing the Digital Output of an Input Means, Ser. No. 879,293 filed on Nov. 24, 1969 now abandoned in favor of continuing applications;
2. Factored Data Processing System for Dedicated Applications, Ser. No. 101,881 field on Dec. 28, 1970;
3. Control System and Method, Ser. No. 134,958 filed on Apr. 19, 1971
4. Control Apparatus, Ser. No. 135,040 filed on Apr. 19, 1971; and
5. Apparatus and Method for Producing High Registration Photo Masks, Ser. No. 229,213 filed on Apr. 13, 1972 now U.S. Pat. No. 3,820,894 issued on June 28, 1974:

all by Gilbert P. Hyatt:

wherein the benefit of the filing dates of this chain of parent applications is herein claimed in accordance with 35 USC 120 and other authorities provided therefore: and wherein said parent applications and the patents issuing thereon as herein incorporated by reference.

This application is related to applications:

6. Coordinate Resolution for Numerical Control Systems, Ser. No. 232,459 filed on Mar. 7, 1972; now U.S. Pat. No. 4,370,720, issued Jan. 25, 1983;
7. Digital Feedback Control System, Ser. No. 246,867 filed on Apr. 24, 1972; now U.S. Pat. No. 4,310,878, issued Jan. 12, 1982.
8. Computerized System for Operator Interaction, Ser. No. 288,247 filed on Sept. 11, 1972 now U.S. Pat. No. 4,121,284 issued on Oct. 17, 1978;
9. Stored Program Data Processing System for Direct Control of a Machine in Real Time with Discrete Signals, Ser. No. 291,394 filed on Sept. 22, 1972;
10. Digital Arrangement for Processing Squarewave Signals, Ser. No. 320,771 filed on Nov. 1, 1972;
11. Apparatus and Method for Providing Interactive Audio Communication, Ser. No. 325,933 filed on Jan. 22, 1973 now U.S. Pat. No. 4,106,540 issued on Apr. 5, 1977;
12. Electronic Calculator System having Audio Messages for Operation Interaction, Ser. No. 235,941 filed on Jan. 22, 1973 now U.S. Pat. No. 4,060,848 issued on Nov. 29, 1977;
13. Illumination Control System, Ser. No. 366,714 filed on June 4, 1973 now U.S. Pat. No. 3,986,022 issued on Oct. 12, 1976;
14. Digital Signals Processor For Servo Velocity Control, Ser. No. 339,817 filed on Mar. 9, 1973 now U.S. Pat. No. 4,034,276 issued on July 5, 1977;
15. Control System and Method, Ser. No. 339,688 filed on Mar. 9, 1973;
16. Data Processor having Integrated Circuit Memory Refresh, Ser. No. 402,520 filed on Oct. 1, 1973;
17. Computerized Machine Control System, Ser. No. 476,743 filed on June 5, 1974; now U.S. Pat. No. 4,364,110 issued on Dec. 14, 1982 and
18. High Registration Photomask Method and Apparatus, Ser. No. 752,751 filed on Dec. 20, 1976 now U.S. Pat. No. 4,120,583 issued on Oct. 17, 1978:

all by Gilbert P. Hyatt.

This application is further related to applications:

19. Interactive Control System by Barry T. Lee, Ralph V. Cole, Irving Hirsch, Gilbert P. Hyatt, and Gunther W. Wimmer, Ser. No. 101,449 filed Dec. 28, 1970 now abandoned in favor of continuing applications; and herein incorporated by reference and
20. Interactive Control System by Barry T. Lee, Ralph V. Cole, Irving Hirsch, Gilbert P. Hyatt, and Gunther W. Wimmer, Ser. No. 354,590 filed on Apr. 24, 1973 now U.S. Pat. No. 4,038,640 issued on July 26, 1977.

Certain of said related applications that have matured or are maturing into U.S. patents have the same disclosure as-filed as contained in certain of said parent and related applications:

wherein said related application Ser. No. 339,817 now U.S. Pat. No. 4,034,276 had the same disclosure as-filed as said parent application Ser. No. 135,040 and wherein said related application Ser. No. 354,590 now U.S. Pat. No. 4,038,640 had the same disclosure as-filed as said parent application Ser. No. 101,449;

wherein said related applications Ser. No. 339,817 and Ser. No. 354,590 having the same disclosure as-filed as said parent applications thereof Ser. No. 135,040 and Ser. No. 101,449 respectively were filed as PTO Rule 60 continuing applications thereof;

wherein the PTO had copied the disclosures of said parent applications thereof Ser. No. 135,040 and Ser. No. 101,449 to obtain the disclosure as-filed for related applications Ser. No. 339,817 and Ser. No. 354,590 respectively in accordance with said PTO Rule 60; and wherein said U.S. Pat. No. 4,034,276 and U.S. Pat. No. 4,038,640 have been provided to the U.S. Patent and Trademark Office for being included in the file wrapper of the instant application.

One skilled in the art will be able to combine the disclosures in said applications that are incorporated by reference with the disclosure in the instant application from the disclosures therein and the disclosures herein.

BACKGROUND OF THE INVENTION

1. Field of the Invention

The present invention is related to machine control systems in general and computerized numerical control systems for machine control in particular.

2. Prior Art

Numerical control systems ae used to control machines such as machine tools. Digital commands are input with a punched tape to describe the part to be cut on a machine such as a milling machine. These commands are accessed by the numerical control system and are executed to drive the machine to automatically cut the part.

Prior art numerical control systems have been designed around special purpose digital devices where operations such as logic, control, and computations are performed with special purpose logic. Because of the high cost and limited capability of these special purpose numerical control systems, most of the computations are preprocessed with a remote, large scale computer using a parts program compiler such as APT. The remote computer preprocesses the information and generates a punched tap in a control oriented language containing the initial conditions and commands required by the special purpose numerical control equipment. These parts program tapes describe the part to be generated and are used as the command inputs to the numerical control system to cut the part. Tape program errors are common, requiring test runs to isolate and correct these errors. When a test run is completed, the parts programmer provides corrections to the remote computer in a compiler oriented language to generate a corrected tape. Turn-around time for a new tape is often twenty four hours and it is common for five corrected tapes to be required before an acceptable production tape is generated. Therefore, a week of parts program checkout time can be required prior to starting production. An expensive numerical control system can therefore be tied up waiting for a production tape to be checked-out and regenerated. In addition, excessive expense can be incurred for repeated use of the remote large scale APT program computer. Other problems and expenses are incurred associated with the uncertainty of when a production tape will be available and the expensive delays in production start up.

In order to simplify programming of complex parts, various parts programming compilers have been developed. The APT compiler is the most common of these parts programming compilers. It is serviced by the Illinois Institute of Technology Research Institute (IITRI) which provides documentation, services, and software for this parts prgram compiler.

An attempt has been made to circumvent the tape correction problems by providing a remote large scale computer operating in a time-shared mode to provide rapid correction of parts programs. In such a system, the remote computer is located in the plant containing the machines and provides storage for the parts programs for many numerical control systems in that plant. In operation, this central computer will transmit a new block of commands to each special purpose numerical control system when the prior block of commands has been executed. When the parts programmer detects an error, he will stop the operation of the numerical control system and enter a correction, which will be transmitted to the remote computer. This correction is made in a compiler oriented language which is acceptable by a large scale computer containing a parts program compiler such as APT. The remote computer will compile a new program, convert it to a control oriented language such as the EIA standard format, then make this corrected parts program available to the special purpose numerical control system for continued operation. Such systems using a remote computer in conjunction with special purpose, non-computerized numerical control systems at every machine are typified by the Sundstrand Omnicontrol and the General Electric Commander systems.

Excessive expenses are incurred with the requirements for these remote computers generating control oriented commands for various non-computerized numerical control systems located at the machine being controlled. In addition, the capabilities of each numerical control system is still limited by the non-computerized numerical control, where the remote larger scale computer can't adequately service all numerical control systems in the shop with any more than parts program modification and superficial preprocessing operations.

The limited capability of the prior art, non-computerized numerical control systems has placed a considerable burden on the parts programmer, system operator, and the entire manufacturing organization. In prior art systems; parts programming requires many unnecessary calculations, workpiece setup and equipment operation are complex, and manufacturing control is very limited. Other problems are encountered due to the limitations of the prior art numerical control systems.

SUMMARY OF THE INVENTION

This invention presents a simple, inexpensive system and method to provide computerized capability for control applications. This system will be described as a milling machine numerical control system. It should be understood that any reference to such a numerical control system is intended to include any system wherein digital command and control capability is to be provided for a machine. The particular system discussed herein is one class of such devices.

A preferred embodiment of the system of the present invention will now be discussed throughout this summary. This embodiment is an advanced numerical control system, which includes a general-purpose digital data processor for high levels of capability and versatility. Computerized capability of the present invention is provided at a price competitive with prior art non-computerized systems, thereby qualifying a computer in a numerical control system at only one machine in contrast to prior art systems. With the present invention, a major portion of the machine shop budget and production capability does not have to be committed to a limited capability, such as is necessary with the expensive central DNC multi-machine control computer used in prior art systems. This computerized numerical control (CNC) system at each machine yields economy, because this system is cost competitive with prior art non-computerized systems that do not have CNC capability, and provides protection of production capability, because the shop is not dependent on a single central DNC computer which can malfunction and shut down the whole production capability. The system of this invention can provide one computer per machine "dedicated" to the individual machine on a stand-alone basis, which operates in conjunction with the machine in real time to provide self-contained CNC capability. Major assemblies in this embodiment include a general purpose digital computer, interactive control panel, multi-axis servo drives, machine interface electronics, memory, CRT display, typewriter, punched tape reader, power supplies, and other equipment. Capability includes complex contouring with linear, circular, and parabolic curves; curve fitting; automatic fairing contours; six axes of simultaneous contouring; digital resolution of 50 millionths (0.000050) inch; departure range of 99.999 950 inches; contouring velocities of 1,200 inches per minute; and other features. Also provided are closed-loop DC servos with resolver feedback; inductosyn (Ferrand Scale) feedback; full absolute position feedback with multi-speed pickoffs and other features.

Special features include automatic tool change with up to 99 tool offsets in core memory, spindle speed control, constant cutter chip load, and adaptive feeds and speeds. Tool history is automatically recorded for preventative maintenance. Thread cutting with direct IPR and RPI (pitch) feedrate programming is provided for lathes, and cutter compensation is available for milling and grinding machines.

Numerical control systems typically accept parts programs from a punched tape reader. The system of this invention may provide access to parts programs from a tape reader, remote large-scale computer, internal memory, or other sources of parts programs. The input data format meets the requirements for "interchangeable perforated tape" as defined in EIA Standard RS-274. Block search and buffer memory features are provided. Data can be entered in either absolute or incremental coordinates, G code selectable, with the capability to mix both coordinate schemes in the same block of commands. Addressing is either variable block or tab sequential. Direct feedrate programming is standard. Full range floating zero and zero offsets are redefinable from the parts program. Other parts programming features included an unlimited number of M and G commands contained in one block, editing symbols such as decimal points, command sequence at the parts programmers convenience, and a full circle can be programmed in one block of commands.

This preferred embodiment of a dedicated computer system includes a computer integrated into the system for versatility, economy, and performance. For example, the control panel is an extension of the computer I/O section. This I/O section is physically partitioned so that many of the interface operations, normally performed in a computer I/O, are physically contained on the panel motherboard. This system is under program control, where control, display, data processing, contouring, and machine control operations are handled under program control by the computer. The executive routine permits time-share operation and self-contained diagnostics. Therefore, the system can be conveniently upgraded to incorporate additional features, primarily by reprogramming the computer.

System checkout uses the computer to automatically check its own operation and the operation of the peripheral equipment including use of diagnostic routines, check-sum, and computer iteration timer. System self-check is accomplished under automatic computer control to verify system operation and isolate malfunctions. Self-check and system test programs are included, where these routines are executed upon system turn-on to verify operation or isolate malfunctions and provide continual system checkout and validity checks during system operation.

Prior art systems use remote computers to process parts program information, but have used local, non-computerized numerical control systems for real time machine control operations. Problems associated with using a remote computer and the limitations of a non-computerized numerical control system have greatly limited their effectiveness. This embodiment of the invention provides a local, dedicated computer contained in the numerical control system for performing the real time machine control operations such as contour interpolation, sequencing a spindle on or off, and other such machine control functions. This embodiment also provides parts program processing to eliminate the need for a remote computer for many applications. In addition, parts program modification capability such as editing capability is provided that does not require the extensive capabilities of a large scale computer with a parts program compiler such as the APT compiler.

In prior art numerical control systems, the parts program is resident on a punched tape, which is loaded through a tape reader to define machine motion and control operations for the particular part to be machined. These prior art systems execute tape commands to machine the part. Use of punched tape has several severe limitations including: (1) the tape reader is the most unreliable part of the system, requiring periodic preventative maintainance and sporadic repair, (2) tape reading errors and tape breakage decrease machine utilization; (3) tape reader speed is low, limiting performance or requiring buffer memory to partially compensate for the low speed; and (4) logistics problems and time delays are involved to generate, duplicate, or modify punched tapes.

Limitations associated with the punched tapes are virtually eliminated with a self-contained parts program memory for parts program storage which overcomes tape reader limitations where: (1) the parts program memory is highly reliable and does not require periodic maintenance; (2) tape breakage does not apply to a parts program memory and reading errors are reduced to the trivial. In addition, the parity check is supplemented with a check sum and validity check to ensure correct operation; (3) parts program memory access time is significantly better than tape reader access time, where the parts program memory effectively operates as a large buffer memory; and (4) logistics problems are greatly reduced where parts programs can be loaded directly into the parts program memory from a remote large scale computer over a telephone line or other data link; parts programs can be modified by the operator, where he can conveniently change a block of commands in the parts program memory thru the keyboard or typewriter; and tape duplication is not required, where a tape would be used for the shop archives but not for continuous machine operation.

Parts programs are loaded into the parts program memory through several interface channels from a punched tape reader, remote large scale computer data link, typewriter punched tape reader, typewriter keyboard, control panel keyboard, or other such devices. Parts program modification is implemented through any or all of these channels. Tapes are accepted with various codes, such as EIA or ASCII codes, and accurate tape loading is assured with techniques such as parity checks, validity checks, and other such techniques.

One embodiment of this invention provides a tape preparation capability, where tapes are generated, checked, modified, duplicated and code converted. The tape punch on the typewriter is used for paper tape, while mylar tape requires an auxiliary tape punch. Tape generation is accomplished by loading a parts program into the memory, then formating and punching a tape in either EIA or ASCII code. Tape checking is accomplished by loading the tape and comparing it with the parts program in the parts program memory. Differences are detected and printed on the typewriter as a permanent record. Tape modification is accomplished by loading and modifying a parts program in the parts program memory, then punching a tape as described above. Tape duplication is accomplished by repetitive punching of a tape from a parts program resident in the parts program memory. Code conversion is accomplished by loading a parts program into the parts program memory in a convenient input code, then punching a tape with the tape generation capability, where EIA, ASCII or other codes may be selected.

Machine information is provided to the shop manager to aid in the determination of machine use, preventative maintenance records, and operator efficiency. A remote readout of current operation is provided which includes feedrate override, operating mode, block sequence number in process, and part in process. This current operation report defines the instantaneous condition of the equipment. A remote readout of past operation includes total time in each mode and cycle-on/cycle-off conditions. Down time and delays are identified and logged based upon type and duration of the condition. Machine historical records are maintained, including machine operation cycles and accumulated time with automatic notification of preventative maintenance.

Parts program editing capability permits complete control of the program checkout process within the shop, precluding the need to depend on outside computer organizations. In addition, start up delays and expenses are significantly reduced. This capability greatly enhances productivity to add to the cost-effectiveness of the numerical control system. Editing of a parts program is performed at the machine during program checkout, resulting in rapid production start up. The internal parts program storage feature provides editing capability for on-line checkout and modification of parts programs. Editing is performed with various devices such as the Manual Data Input (MDI) keyboard or typewriter. Blocks of parts program commands can be added, deleted, modified and verified. An add operation can insert the entered block of commands in-between two other blocks of commands. Similarly, delete and modify operations delete or modify the selected block of commands. A verify operation displays the selected block of commands on the numeric display and prints those commands on the typewriter for "hard-copy" output.

Parts program checkout on prior art numerical control systems requires identification of the program errors at the machine, with correction of errors on a remote large-scale computer. Tape correction logistics are time consuming, where poor availability of the large-scale computer in conjunction with its remote location often preclude rapid turnaround. Several iterations of parts programs checkout and correction may be required, with up to a week of delays due to punched tape turnaround. Numerical control systems can be tied up for that excessive nonproductive period. With the editing capability of the system of this invention, the parts program can be corrected as it is checked-out, thereby eliminating the expensive, time-consuming logistics usually associated with parts program correction.

Parts program changes, such as with the edit capability described hereafter, permit the use of a control oriented language such as the EIA Standard format, instead of requiring a compiler oriented language and the associated large scale computer to generate a parts program or a parts program correction. Therefore, a programmer can generate a parts program or a correction rapidly and enter this program or change directly into this CNC system.

The computerized numerical control system of this invention provides parts program generation capability including parts program editing, data link communication, and tape punching capability usually associated with a central computer facility operating in a direct numerical control (DNC) system. In order to describe the tape generation capabilities of the computerized numerical control (CNC) system of this invention, these capabilities are related to the closest known operations which are found in DNC systems. Therefore, the parts program generation capability of the system of this invention may be referred to herein as DNC capability. The differences between the CNC system of this invention and prior art DNC systems discussed previously will become obvious to those skilled in the art even though DNC terminology may be used to exemplify certain CNC operations in conjunction with the stored parts program feature of this invention. The term "CNC" may be substituted for the term "DNC" used herein to designate the stored parts program capability of the system of this invention.

An object of this invention is to provide a practical computerized numerical control system.

A further object of this invention is to reduce the dependence of the numerical control system on an unreliable tape reader.

A further object of this invention is to reduce the dependence of the numerical control system on a remote large scale computer system.

Still a further object of this invention is to reduce the time and effort in the checkout and correction of a parts program.

The foregoing and other objects, features, and advantages of this invention will be apparent from the following detailed description of preferred embodiments of this invention, as illustrated in the accompanying drawings.

BRIEF DESCRIPTION OF THE DRAWINGS

A better understanding of the invention may be had from a consideration of the following detailed description, taken in conjunction with the following drawings, in which:

FIG. 1 comprises FIGS. 1A and 1B wherein

FIG. 3 is a set of data processor flow diagrams illustrating data processor operations and computations used to perform system operations, wherein FIG. 3A shows mode select program operations, FIG. 3C shows a Block subroutine, FIG. 3D shows an Index subroutine, and FIG. 3E shows a Search subroutine.

DETAILED DESCRIPTION OF THE INVENTION

General Description

Figure 1A:
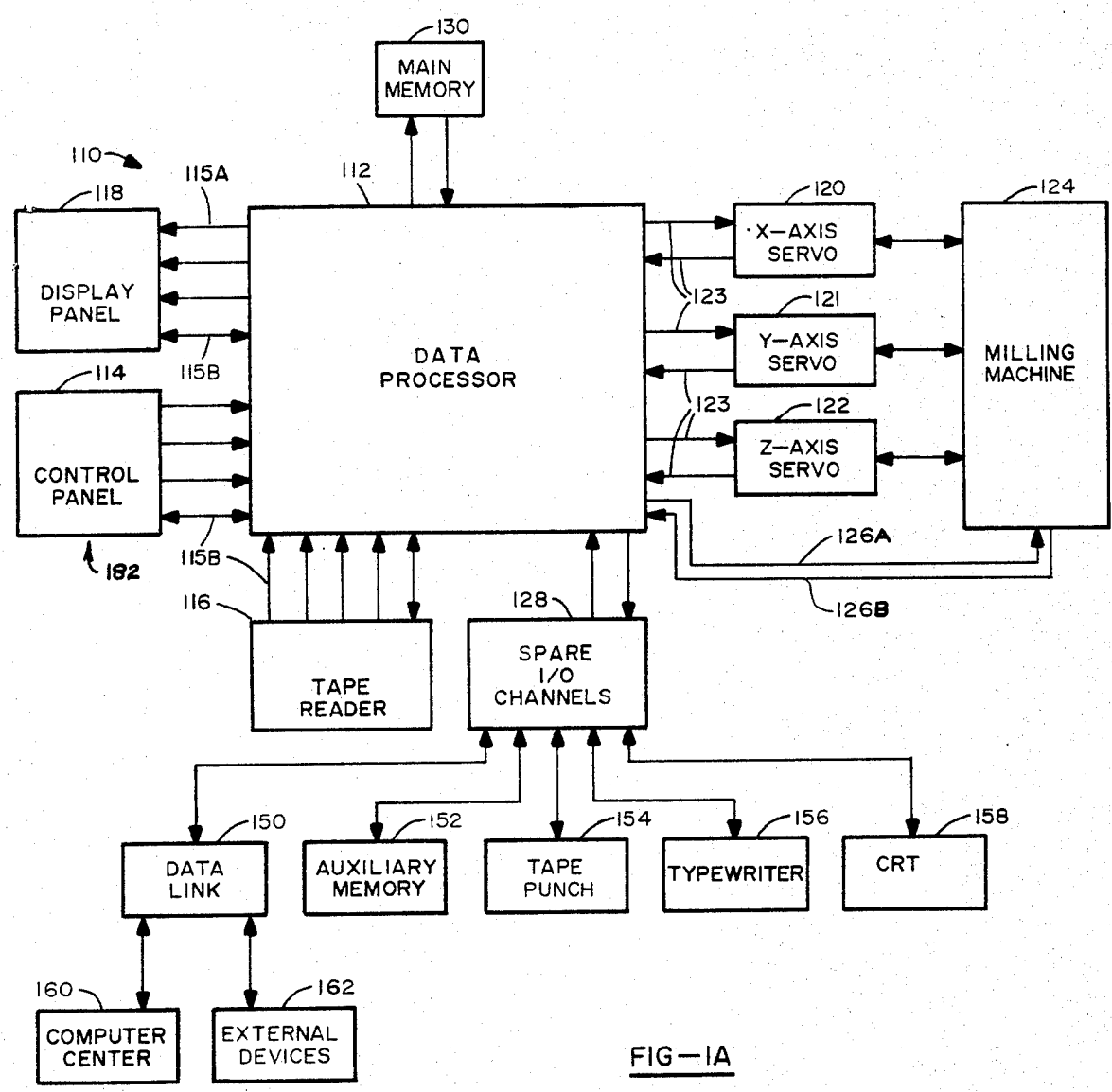
FIG. 1A is a block diagram representation of a numerical control system and FIG. 1B is a block diagram of a stored program data processor in accordance with the invention.

The numerical control system of this invention can take any of a number of possible forms. A preferred embodiment of the present invention is shown in FIG. 1 and will be described in detail hereafter.

By way of introduction of the illustrated embodiment, the components shown in FIGS. 1 through 10 of the drawings have been assigned general reference numerals and a brief description of each such component is given in the following description. The components in each figure have in general been assigned three digit reference numerals wherein the hundreds digit of the reference numerals corresponds to the figure number. For example, the components in FIG. 1 have reference numerals between 100 and 199 and the components in FIG. 2 have reference numerals between 200 and 299 except that the same component appearing in successive drawing Figures has maintained the first reference numeral.

This application is a continuation in part to the previously referenced application Ser. No. 101,881 and describes the special parts program processing capability provided with the system of this parent application.

In a preferred embodiment described hereafter, the parts program memory may be a portion of the main memory 130 shared with the data processor stored program memory; the CNC commands may be entered with the tape reader 116; and the parts program may be entered with the tape reader 116 for storage in the main memory 130. In an alternate embodiment CNC commands and displays can be provided with the control panel 114 and the display panel 118 using available switches and displays and using spare switches and displays described in the previously referenced applications Ser. No. 101,881 and Ser. No. 101,449. Still further CNC capability is provided with the auxiliary input-/output channels 128 described in the previously referenced application Ser. No. 101,881. These auxiliary input/output channels 128 provide access to alternate parts program memories 152, alternate sources of parts programs, alternate sources of CNC commands and displays, and other capability which is discussed in greater detail hereafter.

FIGS. 1A, 1B, 2, 4, 5, and 6 of this application are generally the same as FIGS. 1, 4, 2, 13, 14, and 15 respectively the previously referenced parent application Ser. No. 101,881 and FIGS. 7 through 10 of this application are generally the same as FIGS. 1 through 4 of the previously referenced application, Ser. No. 101,449, both incorporated herein by reference changes such as with new assignments of reference numerals to make those figures compatible with the form of this application.

The system shown in block diagram form in FIG. 1A is described in detail in the copending patent applications set forth under Cross Reference To Related Applications above and incorporated by reference. A brief description of the system is presented under System Description hereinafter. Further, preferred embodiments of various system arrangements are described in sections entitled Tape Reader, Data Processor, Interface Description, Interactive Control System, and Servo Command Structure hereinafter. These arrangements are described in further detail in the related copending patent applications that are incorporated by reference. Still further, a brief description of data processor interface instructions is presented under Instruction Repetoire hereinafter. A detail description of the data processor instruction repetoire is provided in the parent application, Factored Data Processing System For Dedicated Applications Ser. No. 101,881 filed on Dec. 28, 1970 and incorporated by reference herein.

A preferred embodiment of this invention will now be described, where the previously referenced application Ser. No. 101,881 provides the preferred embodiment of this invention. The system 110 is shown in FIG. 1. The data processor 112 communicates with the operator panel 182 comprising the control panel 114 and the display panel 118 over signal lines 115. The primary function of the main memory 130 is to contain the stored program for the data processor 112. In one embodiment, this main memory is a core memory and is also used to store a parts program. The tape reader 116 is primarily used to load a parts program. In one mode of operation, this tape reader 116 is used to access the parts program which is contained on a tape for execution by the data processor 112 to control the machine 124. In another mode of operation, this tape reader 116 is used to access the parts program for loading a parts program memory, which may be a portion of the main memory 130 or auxiliary parts program memory 152.

Various CNC commands are entered through the tape reader 116 and the control panel 114 to provide the CNC capability described in conjunction with the flow diagrams in FIGS. 3A-3E. In addition, special CNC panel controls can be provided for entering CNC commands in place of or in addition to the tape reader means of entering these CNC commands. Other embodiments and methods for providing this capability will become obvious to those skilled in the art from the teachings herein.

The data processor 112 can access other subsystems through the spare I/O channels 128 for alternate sources of CNC commands, alternate sources of parts programs, and alternate parts program memories. The machine 124 is controlled with multiple axis servos 120, 121, and 122 operating from data processor real time command signals 123 and is controlled with various auxiliary command signals 126. These command signals are provided by the data processor 112 which accesses a parts program and computes the command signals required to command the machine 124 to execute the parts program.

System Description

By way of example, a factored computer system is represented in block diagram form in FIG. 1A as a numerical control system 110, including an electronic data processor 112, arranged in accordance with the invention. The specific example referred to here and described hereinafter relates to a three-axis controlled milling machine, but it will readily be appreciated that systems in accordance with the invention may be applied to a wide variety of tasks includes communication, process control, processing of business data and other control functions such as photo optical pattern generators and multi-turret machines.

In accordance with the basic concepts of a factored electronics system, the numerical control system (FIG. 1A) provides an illustration of this factoring process. The data processor is used in conjunction with the various extremities of the system where some of these extremities are elemental extremities. The data processor has a distributed characteristic, where the raw instruction signals comprised of micro operation and operand address signals are communicated in intrinsic signal form to the interface assembly which is physically distributed and set apart from the data processor 112 and the various extremities that communicate with the data processor through this input-output structure.

The data processor 112 is shown by way of this example to be used in conjunction with a core memory 130. The basic architecture of this data processor will permit an integrated circuit memory, such as a read-only memory (ROM), or a randomaccess memory (RAM) or flip-flop type memory to be substituted for the core memory 130 to provide a completely integrated circuit computer which might be called a monolithic computer.

The architecture of the computer is oriented towards a factored computer system to permit the data processor to operate in close conjunction with the extremities for this factored computer system. The special organization and instruction repertoire aid in implementing this factored computer system.

The control panel operates with the data processor in a mutually interdependent fashion to yield interactive capability for operator functions.

The photoelectric tape reader 116 is an extremity that inputs part programs to define the part to be cut by the milling machine 124. The real time non-adapted signal form 115B intrinsic to the tape reader 116 includes not only data but tape reader characteristics caused by photo-optical, electromechanical, and electrical effects that are inherent to the tape reader, described in the referenced application A Method And Apparatus For Processing The Digital Output Of An Input Means. The data processor accepts these intrinsic signal forms directly from the tape reader and derives the required data from the ambiguity and errors present in this intrinsic signal form.

The milling machine 124 is an extremity of the system which can be implemented as an elemental extremity in conjunction with the data processor. Direct control of the various machine functions, such as storing the tool positions, compensating for tool characteristics, and controlling a turret motor for tool selection, reduce the machine interface that is often implemented with relay logic and other such "magnetics". The machines axes pickoffs in the square-wave servo loop can be used directly by the data processor to derive position, velocity and acceleration information pertaining to the motion of machine axes.

The axes servos 120, 121, and 122 are a typical example of elemental extremities. The communication between the data processor and the axes servos is in a signal form wherein the whole number aspect is intrinsic to the data processor and wherein the squarewave aspect is intrinsic to the axes servos. This intrinsic signal form simplifies the communication interface between the data processor and the axes servos and relieves limitations previously imposed on servos for numerically controlled machines.

The operative dispersion associated with this factored computer system is typified by the multi-axes contouring capability of the system. The data processor performs the contouring computations in whole number form intrinsic to the data processor and generates the resultant whole number commands for the axes servos. The operative dispersion provides extremely high levels of performance with a significant reduction in hardware and a reduction in the computational burden placed on the data processor. The intrinsic signal forms of the servos have a whole number square wave characteristic that is acceptable to the data processor in a non-adapted form to provide interactive communication between the data processor and the axes servos to provide adaptive control capability with this elemental extremity. The axes servos illustrate an elemental extremity that can yield a high level of economy and versatility with a reduced burden on the data processor together with the additional capability of adaptive control.

The present invention more particularly incorporates the normal computer functions of controlling, performing mathematical operations, and storing data into a physically distributed, operatively dispersed system providing concurrent internal control of coaction with associated extremities. Although interfacing is not prohibited, these systems utilize substantially direct communication with elemental subsystems as needed for a chosen class of tasks.

Specific data processor features include an adaptive memory control power interrupt technique preventing detrimental systems operation and a memory protect technique creating inalterable fields in an electrically alterable memory. Functional modifiers permit shortened program instructions without sacrifice of program capability or flexibility.

One technical area in which systems in accordance with the invention have particular advantage is in the control of multi-axis machine tools and the control of photo optical plotters to provide output products. Other areas of particular advantage include the processing of communications and business data, for instance, payroll processing and inventory control. In all of these applications the system can receive rudimentary data in real time intrinsic signal form from an elemental extremity such as an axis servo, process the nonadapted intrinsic signals, and provide data to the system. The system in turn commands an output device in a signal form which may be readily useable by or intrinsic to the output device, such as a servo system. Use of the physical distribution and operative dispersion of the system in conjunction with processor-dependent elemental extremities operating in nonadapted language modes permitting great versatility to be attained with low manufacturing cost. Furthermore, orientation of the system to a different class of tasks involves no significant redesign, but primarily involves changes in the data processor program.

A general purpose data processor in accordance with this invention may include multiple data and program registers, a random access memory and a scratch pad memory, and nonbuffered, directly coupled input-output lines connected to elemental input-output manifesting devices. These elements perform basic or prime functions and are physically distributed at different locations in the system, with operative dispersion making them functionally available throughout the system. This system comprises a numerical control machine, e.g. for three axis controlled milling machine, and closely integrates the operator and other input and output functions into the numerical control tasks. Minimal structure input-output extremities in this particular example comprise an elemental tape reader 116 and operator panels 114 and 118, servos 120, 121, and 122 for independent tool axis control and a passive data display 118. The data processor, in real time, concurrently monitors these extremities, pre-processes the external manifestations into machine-adaptable or intrinsic data, and generates extremity intrinsic or extremity-adapted extrinsic commands. The system concurrently operates under programs control to perform the other aspects of the task, including carrying out complex computations for tool path control, generating servo commands for each of the controlled axes, sequencing through the program, providing other machine controls and generating graphical and printed output data if needed.

Part program inputs are provided by a photoelectric punched tape reader having Model No. RRS0304RA, manufactured by Remex Electronics.

Data and program storage is provided by a core memory 130 which may be a commercially available memory having Part No. 909838-A01, manufactured by Electronic Memories, Inc. This is an 8 bit 4096 word core memory which is primarily devoted to program storage. Remaining portions may be used for data storage if desired. In this application, the core memory 130 (CM) may be replaced by a read-only memory (ROM) such as a MOS FET read only memory sold commercially by General Instruments Corporation of Hicksville N.Y. or flip flop memory.

In a typical, very generalized example of the operation of the system of FIG. 1A for control of a milling machine 124, the data processor 112 accepts part program data from the tape reader 116 and operator inputs from the control panel 114 to commence the computation of servo commands. As the reader 116 and panel 114 are operated, however, the processor 112 is under program control to monitor the operative states and pre-processes the rudimentary data itself. Concurrently, and also under program control, the display panel 118 is activated by exciting the passive elements to form desired characters at a flicker-free rate. These time related monitoring and pre-processing subtask functions concerned with the extremities continue to be carried out as needed as the processor 112 enters into its computational and processing functions concerned with its main task, that of executing the part program in real time. Thereafter, command data is translated into servo commands for the individual servos 120, 121, and 122, in intrinsic servo signal form. Feedback signals in the intrinsic servo format are likewise returned to the processor 112, pre-processed for conversion into the processor base language and utilized in further computations.

Programming of computers is a well known art and is described in detail in the prior art literature such as Programming: an Introduction to Computer Languages and Techniques by Ward Douglas Maurer for Holden Day Inc. (1968); Programming for Digital Computers by Joachim Jeenel for McGraw Hill (1959); Fundamentals of Flowcharting by Thomas J. Schriber for John Wiley and Sons (1969); and Elements of Computer Programming by Swallow and Price for Holt, Rinehart, and Winston (1965); incorporated herein by reference. The programs to provide data processor operations described hereinafter will be obvious to those skilled in the programming art from the descriptions of those desired operators. Further, coding of programs for use with the particular computer described herein will be obvious to those skilled in the program art from the description of computer instructions provided hereinafter.

There are profound differences between systems thus arranged and operated and systems of the prior art. In the physical and operational sense, the data processor 112 is a much greater portion of the whole, and the associated units 114, 116, 118, 120, 121, and 122 are extremities of the processor 112. These extremities, which may not be independent in terms of control, are largely directly coupled to the processor 112. Each elemental extremity has certain characteristic relationships to the system, although other differences necessarily exist. Each relies essentially upon the operatively dispersed program capabilities of the processor 112. Each further effectively relies upon the processor 112 for pre-processing of the nonadapted signal forms for interpretation of signals and meaningful time related data transfer. In this respect, digital buffering, conversion, and signal conditioning functions ordinarily provided by interface logic circuits are also avoided. Furthermore, the processor 112 itself need not be tailored in configuration to cooperate with pre-determined interface formats and requirements. In a further respect, the data processor presents data or accepts data in real time from/to system extremities in intrinsic signal forms such that the processor itself can effect the significance of such terms.

Elimination of physical identities are representative of what is herein termed physical distribution, where the processor 112 can be distributed throughout the preponderance of the task-performing system. Yet, by virtue of the operational dispersion of the system and other prime functions, this task-performing system may readily be modified, with a minimum of hardware changes to perform another task. Such change entails the essential modification of the system program, and also modification of the subtask programs, and their relation to the task-pertinent program. It should be appreciated that the operative dispersion of the system encompasses and eliminates much of the interface circuitry that is redundant when used in conjunction with a data processor.

For the performance of many tasks, as in the numerical control field, systems in accordance with the invention can utilize a relatively small-scale computer without overloading. Concurrent performance of the subtasks does not in the usual instance result in excessive demands on the processor. To the contrary for numerical control systems, the general purpose computational capability of the system hereinafter described can generally be utilized to perform many functions such as contouring functions.

The data processor 112 is organized to operate in a manner somewhat similar to presently known stored program digital computers. The fundamental theory and technology of such presently known systems are described in Chapter 11 of *Digital Computer Design Fundamentals*, Yaohan Chu, McGraw-Hill Book Co., Inc. (New York, 1962) incorporated herein by reference.

The data processor is organized to process 8 bit words with most working and storage registers having a 16 bit capacity permitting the storage of two words. Serial transfer of data is used throughout the data processor 112 to minimize the logic and interconnections required.

The data processor 112 includes a 12 bit memory address register (M Register) which defines a memory location being accessed in the main memory 130. A memory data register (D-register) defines an operand location such as in the scratch pad memory and input-/output (I/O) channels. Thirty two Scratch Pad Memory (SPM) Registers provide convenient intermediate storage, independent of the main memory. A three bit counter divides the execution of program instructions into word times and a four bit counter subdivides the word times into bit times, the basic operating intervals.

The data processor operates by executing programmed instructions received from the main memory.

When an instruction is received, control logic causes the data processor to progress through a matrix of micro operations, the exact path varying with the instruction being executed. Each micro operation occurs during one of the eight possible word times, 0 thru 7, and performs a micro operation portion of the instruction being executed. Upon completion of the FZ micro operation the data processor recycles through the matrix to begin execution of the next instruction.

Tape Reader

Referring now to FIG. 1A, the tape reader 116 may be a commercially available paper tape puncher and reader such as Model RRS0304RA manufactured by Remex Electronics. However, it has been found that by implementing this tape reader 116 as an Elemental Extremity and using the Intrinsic Signal Form concept and Operative Dispersion concept, significant advantages can be achieved. These advantages are described in detail in copending application, "A Method and Apparatus For Processing The Digital Output of an Input Means," Ser. No. 879,293 filed Nov. 24, 1969, by Gilbert Hyatt and incorporated herein by reference. This referenced application is now abandoned in favor of the present application. Generally, the system operates by having the data processor sample the output of the tape reader 116 at a cyclic rate which is much faster than the operation of the tape reader 116 in a manner similar to the sampling of the control panel outputs. Punching and formatting of the paper tape is in accordance with EIA standards RS-274-B, interchangeable perforated tape variable block format for contouring and contouring/positioning numerically controlled machines, incorporated herein by reference.

Data Processor

A general purpose data processor is provided with the digital portions fully implementable with integrated circuits. Thus, an integrated circuit read-only memory (ROM) provides an example of a capability not found in present data processing systems. Other examples are a random access memory (RAM) and other types of flip-flop memories used alone or in combinations of integrated circuit memories for this processing system.

As shown in FIG. 1A, the data processor 112 receives data from the various input sources, performs calculations or otherwise manipulates data in accordance with the input information and outputs processed information to control the milling machine 124 through servos 120, 121 and 122 and auxiliary control signals 126A and 126B. The data processor is built from series SN7400 integrated circuits manufactured by Texas Instruments, Inc. which are located on a series of printed circuit boards. These printed circuit boards plug into a Mother board which provides necessary interconnections between the terminals of the printed circuit boards.

The architecture of the data processor 112 lends itself to a fully integrated circuit computer mainframe where all of the logic may be implemented with integrated circuits in a conventional manner and additionally includes an integrated circuit scratch pad memory (SPM). Further, this data processor 112 has the architecture to use an integrated circuit read-only memory (ROM) in place of or in addition to a core memory such as for the main memory 130 providing a data processor with the digital portion constructed wholly of integrated circuit components.

Figure 1B:
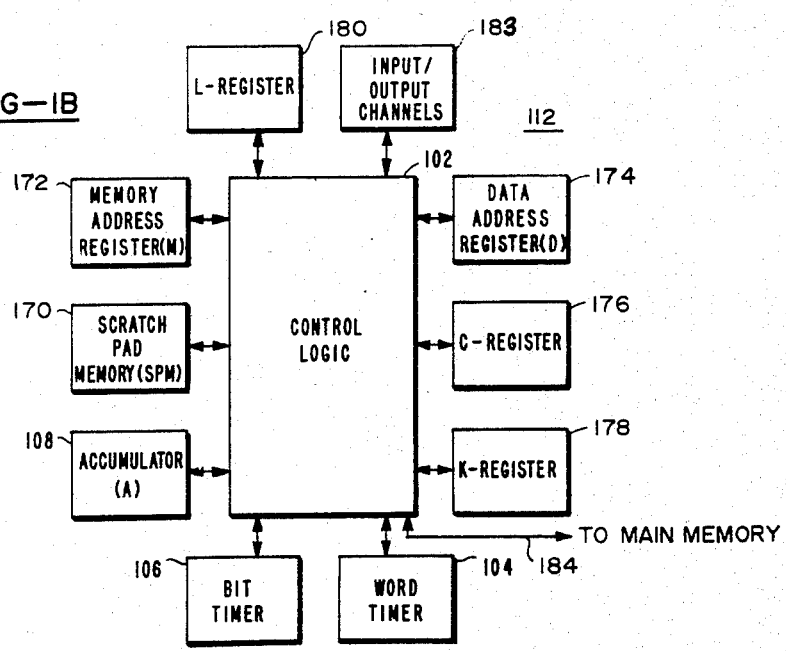

In a somewhat simplified block diagram, the data processor 112 is shown in FIG. 1B as control logic 102 interconnecting registers, timers and communication channels. Signal definitions are provided to permit those knowledgeable in the art to identify the various connections between boards.

The basic timing functions of the data processor 112 are performed by a word timer 104 and a bit timer 106. The fundamental synchronization of the central processor 112 is provided by an 8 MHz clock signal which is included as part of the control logic 102. The synchronizing clock signal is an asymmetric square wave, the positive portion of which is designated $P_3$ and the negative portion of which is designated $\overline{P}_3$. The asymmetrical character of the clock signal permits a longer clock period for stabilization of propogation delays without sacrifice of processing speed. The word timer 104 is a three-bit counter with associated decode logic. It counts from 0 to 7 as the data processor cycles through the micro operations during the performance of an instruction with each micro operation being performed in a different word time. The associated decode logic provides eight output lines, each being true during one of the eight different counting states of the word timer 104. These output signals are used by the control logic 102 for sequencing the data processor through the micro operations associated with an instruction. The bit timer is a four-bit binary counter with associated decode logic. The bit timer 106 counts down from 15 thru 0 and consequently the associated decode logic has 16 output lines, each going true during a different one of the 16 possible counts of the bit timer 106. The bit timer 106 provides sequencing and timing within a given micro operation or word time.

An accumulator (A-register) 108 is the basic arithmetic register and is used as the repository of the results of arithmetic and logical operations. It is also the source and destination of the input/output (I/O) parameters. The A-register is a 16 bit serial in, serial out shift register. Associated with the A-register 108 is a serial full adder which in FIG. 1B is included within the control logic 102.

A scratch pad memory (SPM) 170 provides storage for intermediate parameters such as computational results, return addresses, indexes and other pertinent information. The SPM 170 provides rapid internal storage without the need for transferring data to the main memory 130. It is a group of 32 16 bit serial in, serial out registers which are divided into two pages with 16 registers on each page. Paging is accomplished by toggling a flip-flop, which is automatically set to page 0 when the power is turned on. When the SPM is set to page 0, the data processor acts as if page 1 did not exist; and similarly, when the SPM is set to page 1, the data processor acts as if page 0 did not exist. All of the SPM registers can be used for the storage of information, but some of them are primarily associated with specific functions to increase the efficiency of the data processor. The $SPM_0$ register is generally used as a TX instruction register (decrement and transfer on non-negative) where the index byte to identify the $SPM_0$ register is automatically assumed and need not be programmed in conjunction with the TX instruction. The $SPM_2$ register is used for the return address associated with the execution of transfer-type instructions. In addition the $SPM_2$ register is used as the intermediate register for operands obtained from the constant memory portion of the main memory. The first eight SPM registers can be used for index or TX instructions in addition to scratch pad operations.

A memory address register (M-register) 172 holds the 12 bit address of an eight-bit byte to be accessed from the program memory. The M-register is a 12 bit shift register having the capability to address up to 4,096 different memory locations. It has a serial input and both serial and parallel outputs. Associated with the M-register but represented as being within the control logic 102 is a serial full adder which increments the M-register to access sequential instructions or, as applicable, the next two bytes of in-line instructions. The M-register is incremented by two for a TX instruction when the condition for that transfer is not met, resulting in a skip of two bytes. The M-register is incremented by three for a skip-on-discrete (SD) instruction. The M-register is exchanged with the $SPM_2$ register for transfer type instructions and exchanged with a data address register (D-register) 174 to access operands from the main memory. The M-register is also exchanged with the $SPM_2$ register at the start of an ST instruction which causes the contents of the A-register to be stored in the main memory when implemented with a core memory.

The data address register (D-register) 174 is a 12 bit shift register that usually contains an operand address and is used to select: (a) SPM register, (b) I/O channel, and (c) number of shifts, depending upon the type of instruction being executed. The D-register has a serial input and serial output, with the eight least significant bits ($D_0$–$D_7$) having parallel outputs in addition.

A C-register 176 is composed of six flip-flops designated $C_3$, $C_2$, $C_1$, $C_0$, $K_{11}$, and $K_{10}$ which store the six most significant bits of an eight-bit instruction byte obtained from program memory. The flip-flops $C_3$ through $K_{10}$ store the instruction bits designated $I_7$, $I_6$, $I_5$, $I_4$, $I_3$ and $I_2$, respectively as received from the main memory interface lines (I). These instruction bits are held by the C-register during the performance of an instruction to control the sequence of micro operations executed during the performance of the instruction.

An element designated K-register 178 is not a single register but rather a group of miscellaneous flip-flops for various functions. The $K_6$ and $K_9$ flip flops are not mechanized. The $K_0$, $K_1$ and $K_2$ flip-flops are used primarily to control sequencing through the micro operations. The $K_1$ flip-flop is also used to store the sign of the operand in the A-register and the sign of a decremented number during a TX instruction. The $K_2$ flip-flop is also used to extend the A-register during a shift left operaion where the $K_2$ register acts as the $A_{-1}$ stage of the A-register. The $K_3$, $K_4$, and $K_5$ flip-flops may be grouped together and designated the KA-register and may be used to store the address of the index. The KA-register is also used as an extension of the A-register during a shift left operation with $K_3$ as the $A_{-2}$ stage, $K_4$ as the $A_{-3}$ stage, and $K_5$ as the $A_{-4}$ stage of the A-register. The $K_7$ flip-flop is primarily used as a carry flip-flop in conjunction with the A-register full adder. It is also used in the FK micro operation in the transfer of the D-register contents to the M-register as a shift left operation to multiply the D-register word address by two to obtain the M-register byte address. The $K_8$ flip-flop is used as a carry flip-flop in conjunction with the M-register full adder. As previously described, the $K_{10}$ and $K_{11}$ flip-flops form the two least significant bits of the C-register.

An element designated L-register 180 is, like the K-register, a group of miscellaneous flip-flops performing control functions. The most significant is the $L_1$ flip-flop which controls turn-on and turn-off of the data processor.

Input/output (I/O) channels 183 include whole number and discrete channels. The whole number channels connect the A-register with the various entities and extremities. The whole number I/O channels are arranged in pairs so that as the output from the least significant bit ($A_0Q$) of the A-register shifts information to an output channel with a corresponding input channel simultaneously shifting information into the A-register through the input to the most significant bit ($A_{15}D$).

A data path 184 provides two-way communication between the data processor and the main memory. This path carries the main memory address stored in the M-register and transfers operands to or from the main memory.

Parts Program Operations

The data processor 112 accepts parts program commands at a data rate and at operating times dictated by the source of parts program commands and by the numerical control system operations. The machine 124 requires commands at a rate dictated by the machine considerations such as machine dynamics for contouring; discussed in the previously referenced application, Control System and Method; and machine response time such as for tool change and spindle speed change requirements. These machine command requirements place a real time operation constraint on the control system 110. Real time machine commands are herein intended to mean commands to the machine 124 with time constraints dictated by machine requirements.

Parts program information is typically accessed by a punched tape reader 116 but may be obtained from other sources; where the use of alternate sources of parts programs is presented in the previously referenced application Ser. No. 101,881 particularly page 21 lines 12 through 17, page 22 lines 4 through 7, and other descriptions therein. One source may be a remote large scale computer system that generates the parts program with an APT compiler, then transmits this program over a data link 150 to the CNC system 110. The data link 150 could be a telephone line or other well known means with appropriate terminal devices such as modems that are well known in the art. This data link 150 connects to this CNC system 110 through the auxiliary I/O channels 128 for access of the data by the data processor 112. Another source of parts program data is from a typewriter 156 such as a Teletype model ASR-33 or from other well known sources of digital information such as computer peripherals.

The parts program memory in one embodiment is a portion of the data processor main core memory; but may be a drum memory, disc memory, shift register memory or other such memory well known in the computer art. This parts program memory may be an internal part of the numerical control system 110 as with the main memory 130 and the data processor scratch pad memory, or may be a peripheral of the numerical control system 110 with communication through the spare I/O channels 128. In some cases interface controllers such as a disc memory controller may be required with the peripheral memory. These memories, controllers, and associated devices are well known in the computer art.

A well known auxiliary input and output channel 128 is a 110 baud auxiliary channel for communication with a typewriter 156 such as a Teletype Corporation Model ASR-33, a data link 150, an alpha-numeric CRT 158, a remote large scale computer center 160, or other devices. This 110 baud auxiliary channel provides serial data at a rate of approximately 110 bits per second. Eleven bits are required for each word; comprising a start pulse, eight data pulses and two stop pulses. In this embodiment, the data processor 112 performs the timing, control, sequencing, and buffering operations associated with the signal processing and command signal generation under program control, thereby reducing the requirement for prior art interface control devices.

For data inputs, a well-known transistor line receiver circuit provides digital integrated circuit signal levels. Now referring to FIG. 4, the data processor periodically samples the input line with a Skip-On-Discrete SC instruction thru Discrete Input-2 DI-2 on pin 69 (which is a Skip On ASR input relating to the Teletype Corporation typewriter Model ASR-33) under program control to detect a start pulse. If a start pulse is not detected, the data processor performs other program operations. If a start pulse is detected, the data processor branches to an input program, performing time delay calculations to determine when to sample each successive input sequential bit. This sample time delay precludes errors due to noise such as switch bounce that occurs at the transition between binary states. The data processor assembles the successive serial bits from this input into a digital word, further processes that word for a parity check and a BCD to binary conversion and stores the data for later use. The data processor treats these input signals as rudimentary signals which have a quasi-digital characteristic rather than as absolute digital signals because these rudimentary signals have non-digital characteristics.

For data outputs, the data processor generates commands by loading a sequence of digital command bits into an interface command flip-flop at approximately that 110 cycle bit rate. The data processor assembles the eight bit data word with a one bit leading start pulse and two bit trailing start pulse in the A-Register 108. This word as updated is stored in the data processor for successive output iterations. The data processor fetches this word from storage, then outputs this assembled word to the appropriate auxiliary output channel at a 110 baud rate (approximately 0.009 second intervals), where the appropriate data bit is latched in an interface flip-flop for this period of time inbetween outputs, where this output flip-flop latch excites a well known interface line driver to drive the output device. Two auxiliary output channels will be described for this system, while others will become obvious to those knowledgeable in the art.

The first output channel will be described with reference to FIG. 5. The output word is assembled with the start pulse in the most significant position of the A-Register ($A_{15}Q$), with the next sequential data bits in descending order in that register. The Z11 flip-flop is used as the output flip-flop latch to generate the YL-5 output signal on pin 50 to the line drive and output device. The A-Register word is output under control of the EX-7 input/output instruction, where the A-Register contents are shifted into the Z-Register as P4(AoQ) on pin 48, with the EX-7 instruction gated clock provided as OW-7 on pin 5. The most significant bit of that output word is latched up in the Z11 flip-flop to provide the YL-5 output signal. The assembled word is loaded into the A-Register and is next shifted left to place the next sequential data bit in the most significant position for the next output iteration, then stored in the data processor for further use.

The second output channel will be described with reference to FIG. 4. The output word is assembled with the start pulse in the least significant position of the A-Register (AoQ), with next sequential data bits in ascending order in that register. An interface flip-flop latch is used to generate the output signal to the line driver and output device, which will be obvious to those knowledgeable in the art. The A-Register least significant bit signal AoQ on pin 80 486 is presented to that interface flip-flop, which is then clocked with the DO-1 pulse on pin 71 (which is the ASR Output Set relating to the Teletype Corporation typewriter model ASR-33) generated with a Discrete Output-1, DC-1, instruction. The least significant bit of the A-Register word AoQ is therefore latched up in the interface flip-flop to provide the output signal. The assembled word is loaded into the A-Register and is shifted right to place the next sequential data bit in the latest significant position prior to the next output iteration, then stored in the data processor for further use.

The auxiliary I/O channels 128 can accommodate various other I/O devices 152–158 and the data link 150 can accommodate various other external devices 162 as will be obvious to those skilled in the art from the teachings herein.

In yet another embodiment of this invention, the numerical control system 110 receives parts program commands from a remote computer facility over a data link 150 such as a telephone line. The data processor 112 is responsive to this parts program information and generates responses over the data link 150 to verify receipt of the information, request more information, or other such communication. For example, the parts program can be transmitted over the data link 150 to the numerical control system 110 one block at a time. The numerical control system 110 executes each block as received to control the machine 124 as commanded by the parts program. The numerical control sytem 110 also requests a new block when required. This form of operation permits CNC operations without the requirement for the parts program memory or the tape reader as the sources of parts program commands.

CNC operations may use the operator panel controls such as the selector switches and momentary switches. The control panel 114 permits convenient addition of switches as described hereinafter. The lamp and numeric displays inform the operator of the system conditions. Position of the Mode selector switch 240 in conjunction with the CNC condition lamp displays 270, 272, 274, 276, 278 define the response of the data processor 112 to operator commands.

One of the modes of operation provides typewriter inputs such as with a Teletype Model ASR-33, connected to the system with well known interface devices for communicaton between the operator and the system. Various letter symbols typed by the operator are used as commands to the data processor such as E for edit or input a tape, C for check a tape, R for record or output data and other such symbolic commands. Numbers following a letter command further define the command parameters.

Still another means for providing DNC commands is over a data link 150 such as communicating with a remote computer system 160. This remote computer system may be a time share system, a remote batch processing system, or other computer system such as the system 360 manufactured by International Business Machines and the Model 1108 manufactured by Univac.

CNC commands can be obtained from many sources to select the modes of operation, the sources of parts program commands, and other commands. These various sources will become obvious to those skilled in the art from the teachings herein.

Tape Reader CNC Commands

The numerical control system 110 will now be discussed using the tape reader 116 to provide CNC commands and to enter parts programs. It will become obvious that CNC commands can be provided from various other devices such as from a panel 114, a typewriter 156, a data link 150 or from other sources of CNC commands. CNC commands can be entered with the tape reader 116 using letters, numbers, and control characters punched on a tape with a tape punch 154 such as a Frieden Flexowriter or a Teletype Model ASR-33 which are well known in the art. The operator starts operations by locating the CNC command tape in the tape reader 116, positioning the Mode selector switch 240 to the Continuous position 288, and depressing the Cycle Start switch 246. The data processor 112 detects this switch condition and controls the tape reader 116 to read the CNC tape command. The first command on the CNC command tape should be an Enter CNC command defined with the characters D01, which will cause the data processor 112 to enter the CNC condition. The last command of the command tape should be an Exit CNC command defined with the characters D02, which will cause the data processor 112 to exit the CNC condition. Various CNC Modes can be commanded with CNC tape commands D03 through D89. For example; D03 will command CNC edit, D04 will command CNC Record, D05 will command CNC Execute, D06 will command CNC Deletion of the selected block in the parts program memory, D07 will command CNC Deletion of the complete parts program stored in the parts program memory, and D09 through D89 will command various other CNC operations that will become obvious to those skilled in the art from the teachings herein. The operation of these CNC modes will be described in detail hereafter in conjuncton with the control panel alternate source of CNC commands. The execution of these CNC commands may be substantially independent of the source of these CNC commands. The primary differences may be related to the operation of the CNC command means. For example, a CNC command from the tape reader 116 is in a different form than a CNC command from the panels 114 and 118; but the execution of this command by the data processor 112 may be substantially the same for both command means. The data processor 112 accepts commands in various forms and executes these commands as defined by the stored program.

Selection of the source of parts program commands is made with CNC tape commands D90 through D99; where D90 will select the tape reader 116, D91 will select the data link 150, D92 will select the typewriter 156, and D93 through D99 will select various other sources of parts programs. Following a parts program selection command, the operator will set up the system such as locating the parts program tape in the tape reader 116, then depress the Cycle Start switch 246 to initiate loading of the parts program.

From the description of the panel operation in the section entitled Interactive Control System presented hereafter, it will become obvious that the CNC commands described herein for a tape reader input can also be provided with the operator panel command input means.

Additional CNC capability can be provided with the tape reader 116 or other device such as the Teletype model ASR-33, where the data processor 112 accepts these commands and executes these commands as described below.

A CNC command to record or output data can be defined by: R $F_1F_2F_3F_4$, $L_1L_2L_3L_4$ A where the letter R defines a record or output command, the four F characters define the sequence number of the first block to be output, the four L characters define the the sequence number of the last block to be output, and the A character defines an ASCII output code. If the A character were replaced by an E character, then an EIA output code would be used. If the A character were replaced by a B character, then a simple binary code would be used. The data processor 112 outputs the selected portion of the parts program in the format and code defined by this CNC command and to the channel selected. That channel could be connected to a tape punch 154, a typewriter 156, a CRT 158, a data link 150, or other output means 152 through the auxiliary I/O channels 128.

A CNC command to check data can be defined by: C $F_1F_2F_3F_4$, $L_1L_2L_3L_4$ A; where the letter C defines a check command, with the other command characters defined previously. The data processor 112 will compare parts program blocks from a source of parts program commands such as the tape reader 116 with the parts program stored in the parts program memory 130 and output the differences. The data processor 112 will load a block of commands from the selected external source of parts program commands, compare this block with the corresponding stored block, and output both blocks if they do not compare. Two columns of printouts will result. If the sequence numbers can be matched up but the commands don't compare, then the data processor 112 will output the stored block in one column and the input block in a second column. If the sequence numbers can't be matched up, either a block was added or a block was deleted, where that block will be output in the appropriate column. Check outputs as printouts such as to a typewriter 156 can constitute a listing of editing changes made to the parts program. Check outputs such as to a tape punch 154 can provide an edit record to be used to correct the original parts program. Check outputs to a data link 150 can provide edit parameters to a remote large scale computer system to be used in generating a parts program update in source language. This check operation can verify that the parts program had been properly loaded by performing this CNC check operation with the same parts program after loading the parts program into the parts program memory. This check operation can verify that the parts program had been properly output such as punched on a tape in the record operation by performing this CNC check operation, such as with the new tape after punching that tape. Other uses of the CNC check operation will become obvious to those skilled in the art from the teachings herein.

A CNC command to edit or input data can be defined by: E $F_1F_2F_3F_4$, $L_1L_2L_3L_4$ A; where the letter E defines an edit or input command, with the other command characters defined previously. The data processor 112 will load the parts program from a source of parts program commands such as the tape reader 116 and store it in the appropriate order in the parts program memory 130. A single block will be loaded when the four F characters are the same as the four L characters, defining a start address that is the same as the stop address. In this manner a single block can be added or used to overlay or replace an existing block in the parts program memory 130.

A CNC command to delete data can be defined by: D $F_1F_2F_3F_4$, $L_1L_2L_3L_4$ A; where the letter D defines a delete command, with other command characters as defined previously. The data processor will delete the blocks of parts program commands in the parts program memory defined by the F thru L sequence numbers.

A CNC command to execute the parts program can be defined by: X $F_1F_2F_3F_4$, $L_1L_2L_3L_4$ A; where the letter X defines an execute command, with the other command characters defined previously. The data processor 112 will execute the blocks of commands defined by the F thru L sequence numbers to control the CNC system 110, including the machine 124.

Other CNC commands and command formats will become obvious to those skilled in the art.

Various lamp displays may be used to display the CNC conditions and modes. These displays are optional and are used primarily for identification of the system conditions to the operator. The display panel 118 permits convenient addition or modification of lamp displays and operation, as described in the section entitled Interactive Control System presented hereafter. Although these displays may be discussed in conjunction with one embodiment of this invention, these displays may be omitted and other display arrangements may be used that will become obvious to those knowledgeable in the art.

Panel CNC Commands

The use of several switch controls and lamp displays, as provided for in the panel design, will permit CNC operation to be controlled from the panel. Use of the control panel to process parts program commands is discussed herein. The operation of one embodiment of the panel CNC functions, shown in FIG. 2, will next be described. The switches that control the CNC operation are the CNC Source Select switch 280 and the CNC Mode switch 282. Lamp displays may be used to define the CNC modes. In one embodiment, these are the CNC lamp 270, the Execute lamp 272, the Edit lamp 274, the Delete lamp 276, and the Record lamp 278. Activation of the CNC Source switch 280 will alert the data processor to an operator command to change the source of parts program commands. The data processor 112 will alternately toggle the CNC lamp 270 to the on state, then to the off state, then to the on state and so forth in response to each activation of the CNC Source Select switch 280, alternately selecting the parts program memory and the tape reader as sources of parts program commands. When the CNC lamp 270 is illuminated, the system is in the CNC condition; where the data processor will operate on the parts program commands stored in the parts program memory. When the CNC lamp 270 is extinguished, the system is in the Tape condition; where the data processor will operate on the parts program entered through the tape reader 116. Additional sources of parts program commands can be selected with the CNC Source Select switch 280, which can be used to sequence the spare lamp displays 218 through a sequence of conditions similar to that discussed hereafter for the CNC Mode switch 282 and lamp displays 272, 274, 276, and 278.

The flexibility in defining the operation of the control panel switches and the display panel lamps with the data processor under program control is described hereafter.

In one embodiment of CNC operation, the lamp displays 223 are used to define system conditions. One of the CNC mode lamps 272, 274, 276, and 278 will be illuminated to define which of the four CNC modes has been selected. The CNC Mode switch 282 will permit the operator to sequence the system through the modes until the CNC mode that is displayed satisfies the operator. Each depression of the CNC Mode switch 282 by the operator will cause the CNC Mode lamp that is illuminated to be extinguished and will cause the next CNC Mode lamp in sequence that is extinguished to be illuminated. Each depression of the CNC Mode switch 282 will cause the next one and only that one CNC mode lamp to be illuminated in the sequence of first the Execute lamp 272, next the Edit lamp 274, next the Delete lamp 276, next the Record lamp 278, and then back to the Execute lamp 272.

CNC Operation

The operation of the system will next be described for the embodiment where CNC commands are entered with the panel 114. Other CNC command means can also provide these commands such as previously described.

A new parts program can be loaded from a tape through the tape reader 116 into the parts program memory. This CNC operation is performed with the CNC lamp 270 illuminated, the Edit lamp 274 illuminated, the Mode Selector switch 240 in either the Continuous position 280 or the Block position 282, and the tape properly placed in the tape reader. When the operator depresses the Cycle Start switch 246, the data processor 112 will sense this CNC command, load a block of tape parts program commands, then place this block of tape commands in the parts program memory in the order of the sequence numbers. If the sequence number of a block of commands from the tape does not correspond to any sequence number in the stored parts program, the tape block will be inserted inbetween the closest adjacent sequence numbers of the stored parts program memory. If the sequence number of a tape block corresponds to the sequence number of a stored block, then the tape block will replace the stored block in the parts program memory. If the parts program memory had been cleared with the Delete mode, then the complete parts program from the tape will be loaded sequentially into the parts program memory. The term "load" is intended to include not only entering of data, but also the required preprocessing operations. In the block mode 286, the data processor will load a single block for each depression of the Cycle Start switch 246. In the Continuous mode 280, the data processor will load a sequence of blocks for a single depression of the Cycle Start switch 246; stopping only for an end-of-program or end-of-tape command or when the parts program memory is full.

Execution of a stored parts program from the parts program memory is performed with the CNC lamp 270 illuminated, the Execute lamp 272 illuminated, and the Mode Selector switch 240 in either the Continuous position 280 or the Block position 282. In addition, the sequence number of the first block to be executed should be searched for and displayed on the sequence number display by performing the Search operation as described hereafter. When the operator depresses the Cycle Start switch 246, the data processor 112 accesses the displayed block of commands from the parts program memory and executes this block of commands. In the Block mode, data processor 112 will execute a single block of commands for each depression of the Cycle Start switch 246. In the Continuous mode, the data processor 112 will execute a sequence of blocks of commands for a single depression of the Cycle Start switch 246; stopping only for an operator commanded stop or parts program commanded stop.

Editing of a stored parts program from the parts program memory with the keyboard 244 is performed with the CNC lamp 270 illuminated, the Edit lamp 274 illuminated, and the Mode selector switch 240 in the Keyboard position 284. The new block to be entered is entered with the keyboard 244 and verified with the numeric display 238, as described hereafter. This displayed block is then loaded by depressing the Cycle Start switch 246. If the sequence number of the displayed block corresponds to the sequence number of a stored block, the data processor 112 will replace the stored block with the displayed block in the parts program memory. If the sequence number of the displayed block does not correspond to the sequence number of a stored block, the data processor 112 will place the displayed block in the proper sequence in the parts program memory. Next, the data processor 112 will assemble the stored parts program for more efficient storage; which may be performed automatically or upon special command.

Verification of a block of stored parts program commands is performed visually with the CNC lamp 270 illuminated, the Mode selector switch 240 in the search position 290, and the selected sequence number displayed with the numeric display 238. Depression of the Cycle Start switch 246 will command the data processor 112 to search for the selected block and display that block on the numeric display 238. If the selected block is not in the parts program memory, the system error lamp 236 will be illuminated.

Deletion of a block of commands is performed with the CNC lamp 270 illuminated, the Mode selector switch 240 in the Keyboard position 284, and the Delete lamp 276 illuminated. The sequence number of the block to be deleted is entered with the keyboard 244, then the Cycle Start switch 246 is depressed to command the data processor 112 to delete the selected block. The data processor 112 will assemble the parts program for more efficient storage, either automatically or upon special command. If the selected block was the largest number displayed, 9999 for this system; then the data processor 112 would delete the complete stored parts program in the parts program memory.

Punching a tape consisting of the parts program in the parts program memory is performed where first the operator will search for the first block to be punched then the operator will enter the sequence number of the last block to be punched through the keyboard 244. With the CNC lamp 270 illuminated, the Mode selector switch 240 in the Keyboard position 284, and the Record lamp 278 illuminated; depression of the Cycle Start switch 246 by the operator will command the data processor 112 to start punching a tape of the stored parts program through an auxiliary I/O channel 128 to a tape punch 154.

Data Processor CNC Operation

The data processor 112 executes the executive program to control all operations and provide for time sharing with program routines. The data processor detects inputs and conditions with the executive program, then transfers to the various program routines necessary to perform the computations and generate the outputs. Operations may be handled on a sequential, interrupt, or priority basis well known in the art. The data processor can execute programs on a time shared basis by branching out of subroutines as is well known in the art. For simplicity of description, relatively complex programs such as time shared operations are not shown in the flow diagrams in FIGS. 3A–3E, but will become obvious to those skilled in the art from the teachings herein.

Figure 3B:
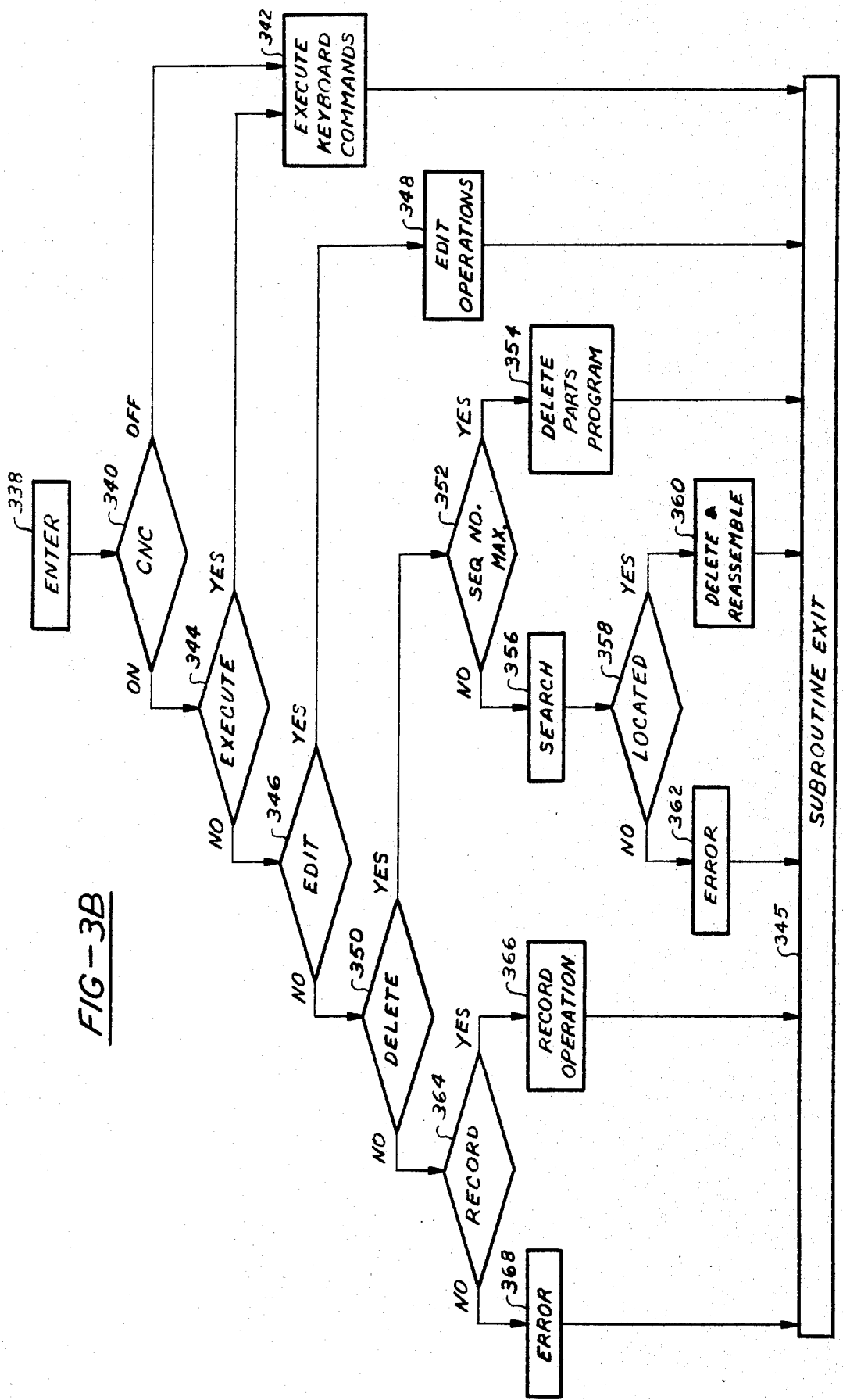
FIG. 3B shows a Keyboard subroutine.

The data processor CNC stored program can be understood with reference to FIGS. 3A–3E, which are flow diagrams that illustrate the CNC operations. The mode select logic is shown in FIG. 3A, where the data processor under program control enters the mode select logic subroutine from the executive routine 300 along the path 302 to check for a cycle on condition in operation 304. If a cycle on condition exists, the data processor is performing operations that supersede this mode selection subroutine, so the data processor loops along path 306 to exit 308 to continue the in-process operations. If a cycle off condition exists, the data processor follows path 305 and checks for a cycle start command from the operator with the Cycle Start switch 246 in operation 310. If this command is not generated, the data processor maintains the system in the cycle off condition and exits from the mode logic subroutine along path 312. If the cycle start command is generated, the data processor sets the cycle on condition in operation 314 and proceeds to decode the operations to be performed. It should be noted that the cycle on condition will cause the data processor to exit from this mode logic subroutine through exit 308 on subsequent iterations until the data processor completes the required cycle on operations and again enters the cycle off condition. The data processor checks the condition of the Mode selector switch 240 in operations 316 through 324 and branches to the appropriate subroutines 326 through 336. The Keyboard mode is tested in operation 316, where the data processor enters the Keyboard subroutine 326 is the Keyboard mode is commanded. If the Keyboard mode is not commanded, the data processor proceeds to test for the Block mode in operation 318, where the data processor enters the Block mode subroutine 328 if the Block mode is commanded. If the Block mode is not commanded, the data processor proceeds to test for the Continuous mode in operation 320, where the data processor enters the Continuous mode subroutine 330 if the Continuous mode is commanded. If the Continuous mode is not commanded, the data processor proceeds to test for the Index mode in operation 322, where the data processor enters the Index mode subroutine 332 if the Index mode is commanded. If the Index mode is not commanded, the data processor proceeds to test for the Search mode in operation 324, where the data processor enters the Search mode subroutine 334 if the Search mode is commanded. If the Search mode is not commanded, the data processor branches to an error subroutine 336 because all proper alternatives had been tested, leaving only erroneous alternatives. The data processor is not responsive to the Cycle Start switch when the system is in the Jog mode and, therefore, that operation is not presented in FIG. 3A.

The Keyboard subroutine 326 is shown in FIG. 3B where the data processor enters this subroutine through operation 338 and tests for the CNC condition in operation 340. If the DNC condition is off as defined by the DNC lamp 270 extinguished, the data processor executes the displayed keyboard commands in operation 342 and exits the subroutine in operation 343. If the CNC condition is on as defined by the CNC lamp 270 illuminated, the data processor tests for the Execute mode in operation 344 as defined by the state of the Execute lamp 272. If the Execute mode is selected, the data processor executes the displayed keyboard commands in operation 342 and exits the subroutine in operation 343. It should be noted that the execution of the displayed keyboard commands in operation 342 is the same independent of whether the CNC condition is on or off. If the Execute mode is not selected, the data processor tests for the Edit mode in operation 346 as defined by the state of the Edit lamp 274. If the Edit mode is selected, the data processor performs the edit operations 348 by first searching for the displayed sequence number in the parts program memory. If the stored sequence number is located in the parts program memory, the data processor replaces the stored block of commands with the displayed block of commands in the parts program memory. If the data processor does not locate the stored sequence number in the parts program memory, the data processor stores the displayed block of commands inbetween the two blocks of stored commands with the next highest and next lowest sequence numbers. After this edit operation, the data processor reassembles the stored parts program in the parts program memory for more efficient storage. The data processor then exits the Keyboard subroutine 326 through operation 343. If the Edit mode is not selected, the data processor tests for the Delete mode in operation 350, as defined by the state of the Delete lamp 276. If the Delete mode is selected, the data processor performs the delete operations 352 through 362. A test is first made of the sequence number in operation 352. If the sequence number is the maximum value (9999), then the data processor branches to operation 354 which deletes all stored parts program blocks in the parts program memory to clear that memory. If the sequence number is not the maximum value, then the data processor branches to operation 356, where the data processor searches for the selected block of commands in the parts program memory and tests to determine if the block is located in operation 358. If that block is located, then the data processor branches to operation 360 where that block is deleted and the stored parts program is reassembled in the parts program memory for more efficient storage. The data processor then exits the Keyboard subroutine through operation 343. If that block is not located, the data processor branches to the error subroutine 362 because the delete command can't be executed on a block that is not stored in parts program memory. If the Delete mode is not selected, the data processor tests for the Record mode in operation 364, defined by the state of the Record lamp 278. If the Record mode is selected, the data processor performs the record operation 366 by punching a tape of the parts program stored in the parts program memory. An auxiliary tape punch 154 would be used, where this tape punch 154 and the required data processor interface for the tape punch are well known in the art. If the Record mode is not selected, the data processor branches to an error subroutine 368 because all proper alternatives have been tested, leaving only erroneous alternatives.

The Block subroutine 328 and the CNC Continuous subroutine 330 will now be described with reference to FIG. 3C because of the similarity in executing a single block of commands, where the decision operation 376 defines whether a block or a continuous operation will be executed as discussed hereafter. The primary difference is that the data processor in the Block mode will automatically return the system to the cycle off condition after execution of that block of commands, while the data processor in the Continuous mode will not automatically return the system to the cycle off condition, but will continue to execute blocks of commands until commanded to enter the cycle off condition. The data processor enters the Block or Continuous subroutine through operation 370 and tests for the CNC condition in operation 371. If the CNC condition is off, the data processor accesses the next block of commands from the tape through the tape reader 116 in operation 372 and executes this block of commands in operation 375. If the CNC condition is on, the data processor tests the Execute mode in operation 373. If the Execute mode is selected, the data processor accesses the next block of commands from the parts program stored in the parts program memory in operation 374 and executes this block of commands in operation 375. After execution of a block of commands from either the tape or the parts program memory, the data processor tests for the Block mode in operation 376. If the Block mode is selected, the data processor branches to operation 377 and sets the cycle off condition. The data processor then exits to the executive routine 382. If the Continuous mode is selected, the data processor directly exits the subroutine through operation 382. If the Execute mode is not selected, the data processor will test for the Edit mode in operation 378, defined by the state of the edit lamp 274. If the Edit mode is selected, the data processor reads the tape from the tape reader and stores that parts program in the parts program memory in operation 379. A test is made for an end of program command in operation 380. If an end of program command is not detected, the data processor branches back to operation 379 to access additional tape commands. When an end of program command is detected on the tape in operation 380, the data processor stops loading the parts program from the tape, stops the tape reader, and branches out of the loading loop to the executive routine 382. If the Edit mode is not selected, the data processor enters the error subroutine 381 because all proper alternatives have been tested, leaving only erroneous alternatives.

The Index subroutine 332 is shown in FIG. 3D, where the data processor enters this subroutine through operation 382, directly executes the Index command in operation 383 by driving the machine to the index position, then exits the Index subroutine 332 to the Executive subroutine 384. The CNC condition is not tested because the same index operation is common to both, the CNC condition and the Tape condition.

The Search subroutine 334 is shown in FIG. 3E where the data processor enters this subroutine through operation 386 and tests for the CNC condition in operation 388. If the CNC condition is off, the data processor searches the tape with the tape reader for the displayed sequence number in operation 392. If the CNC condition is on, the data processor searches the parts program memory for the displayed sequence number in operation 390. When the selected block is located, the data processor branches to operation 396 which displays the selected block, then exits to the executive routine through operation 398.

When stored parts program commands are deleted, parts program memory locations previously used become available within the sequence of stored parts program commands. Assembly of the stored parts program by shifting the locations of the subsequent commands to fill the vacant storage locations provides a more efficient manner of storage. Similarly, when stored parts program commands are added, these new commands must be inserted between previously stored adjacent commands. Assembly of the stored parts program by shifting the locations of the subsequent commands to vacate an area of storage locations for the added commands provides a more efficient manner of storage.

A parts program usually incorporates three digit sequence numbers arranged in ascending order as defined in the EIA Standards. When a block is added, appropriate sequence numbers are therefore not available. In this embodiment a fourth, fractional, sequence number digit is provided to permit new blocks to be added and numbered in ascending order. This fractional sequence number digit may then be used in operation or the data processor can be commanded to reassign three digit sequence numbers in ascending order to conform to the EIA Standards.

One embodiment of this invention uses CNC mode lamp displays to define the operating condition to the operator. The data processor assembles a group of discrete control bits into a lamp display control word which is then output to selectively illuminate the selected lamps as described hereafter. It should be noted that the data processor also stores this lamp display control word to define system conditions. Therefore, when the data processor tests the lamp displays; it actually accesses the stored lamp display control word and processes the appropriate lamp control condition. If lamp displays are not implemented, the data processor provides the control words, which may still be referred to as the lamp conditions.

Instruction Repertoire

The program instructions for the numerical control system 110 are encoded as 8-bit bytes, each byte being stored in a different program memory location of the program memory. The instructions may have multiple bytes, but most have a length of only 1 byte. Each instruction contains an operation code in the most significant portion, and, when required, an operand address in the least significant portion. Indexing is achieved with an index functional modifier byte preceding the instruction whose operand address is to be indexed. Operands can be located in any of the SPM Registers, the constant memory part of the program memory, or in the two program memory bytes following an instruction (in line).

EX (input/output word) $1010\text{-}I_3I_2I_1I_0$

This is a one-byte indexable instruction wherein the four most significant bits identify the operation code and the four least significant bits identify and I/O channel address. The contents of the A-register are output to the addressed channel while the contents of the addressed channel are simultaneously loaded into the A-register. A shift enable signal is output to gate 16 clock pulses to the selected channel.

$FAB - C_3Q \cdot \overline{C_2Q} \cdot C_1Q \cdot \overline{C_0Q} \cdot W1$. The FAB micro-operation occurs in word time 1 and has a duration of 16 bit times. The contents of the A-register are shifted to a selected output channel while the contents of a selected input channel are simultaneously shifted into the A-register.

The data processor can generate discrete outputs (DO) to meet specific requirements under program control. The DO assignments are:

DO-0 Set interrupt enable.
DO-1 Provide clock pulses to ASR-33 (TELETYPEWRITER).
DO-2 Provides a clock to set the power turn-on interrupt, $L_1$. A DO-2 instruction (1100-0010) will be explained in program memory location $40_{16}$ to reset $L_1$ during power turn-on.
DO-3 Iteration timer reset.
DO-4 Trigger to $I_2$ latch, the discrete input 4(DI-4) toggle. The $I_2$ flip-flop is automatically zero set during the power on sequence.
DO-5 Trigger to $I_3$ latch, the discrete input-5(DI-5) toggle. The $I_3$ flip-flop is automatically zero set during the power turn-on sequence.
DO-6 Trigger to the $I_4$ latch, the discrete input-6 (DI-6) toggle. The $I_4$ flip-flop is automatically zero set during the power turn-on sequence.
DO-7 Intensity control (2 line) (not implemented).
DO-8 Toggles the $I_1$ flip-flop causing scratch pad memory paging.
DO-9 Main memory paging.
DO-10 Spare.
DO-11 Servo set.

DC (discrete output) $110I_4 - I_3I_2I_1I_0$

This is a one-byte indexable instruction wherein the three most significant bits define the operation code and the five least significant bits define an output channel address. A discrete output signal, an inverted 3 microsecond pulse is generated on the addressed output channel.

The data processor can operate on a discrete input (DI) with a skip-on-discrete instruction under program control. The discrete inputs are various low frequency digital signals. The purpose of the discrete inputs is to define a status or condition. The DI assignments are:

DI-0 Spare
DI-1 Skip unconditional.
DI-2 Skip on ASR-33 (TELETYPEWRITER).
DI-3 Skip on the sign of (A).
DI-4 Skip on $I_2Q$ latch (DO-4 trigger).
DI-5 Skip on $I_3Q$ latch (DO-5 trigger).
DI-6 Skip on $I_4Q$ latch (DO-6 trigger).
DI-7 Skip on logical overflow in A-register.
DI-8 Used for troubleshooting.
DI-9 Skip on arithmetic carry from A-register.
DI-10 Skip on positive.
DI-11 Skip on servo ready.

SK (skip on discrete) $111I_4 - I_3I_2I_1I_0$

This is a one-byte indexable instruction wherein the three most significant bits identify the operation code and the five least significant bits identify a discrete input channel address. If a discrete exists on the addressed channel, three bytes (usually a transfer instruction) are skipped and the next instruction is obtained from the fourth byte following the skip on discrete instruction. If a discrete does not exist on the addressed channel, the next instruction (usually a three-byte transfer instruction) is obtained from the three bytes immediately following the skip on discrete instruction.

FAG—$C_3Q \cdot C_2Q \cdot C_1Q \cdot W1$ The FAG micro-operation occurs in word time 1 and has a duration of 12 bit times. It is used for the skip on discrete instruction. If the selected discrete is true, the M-register is clocked and incremented by three. If the selected discrete is false, the M-register is not clocked and is therefore not incremented.

Interface Description

Figure 4:
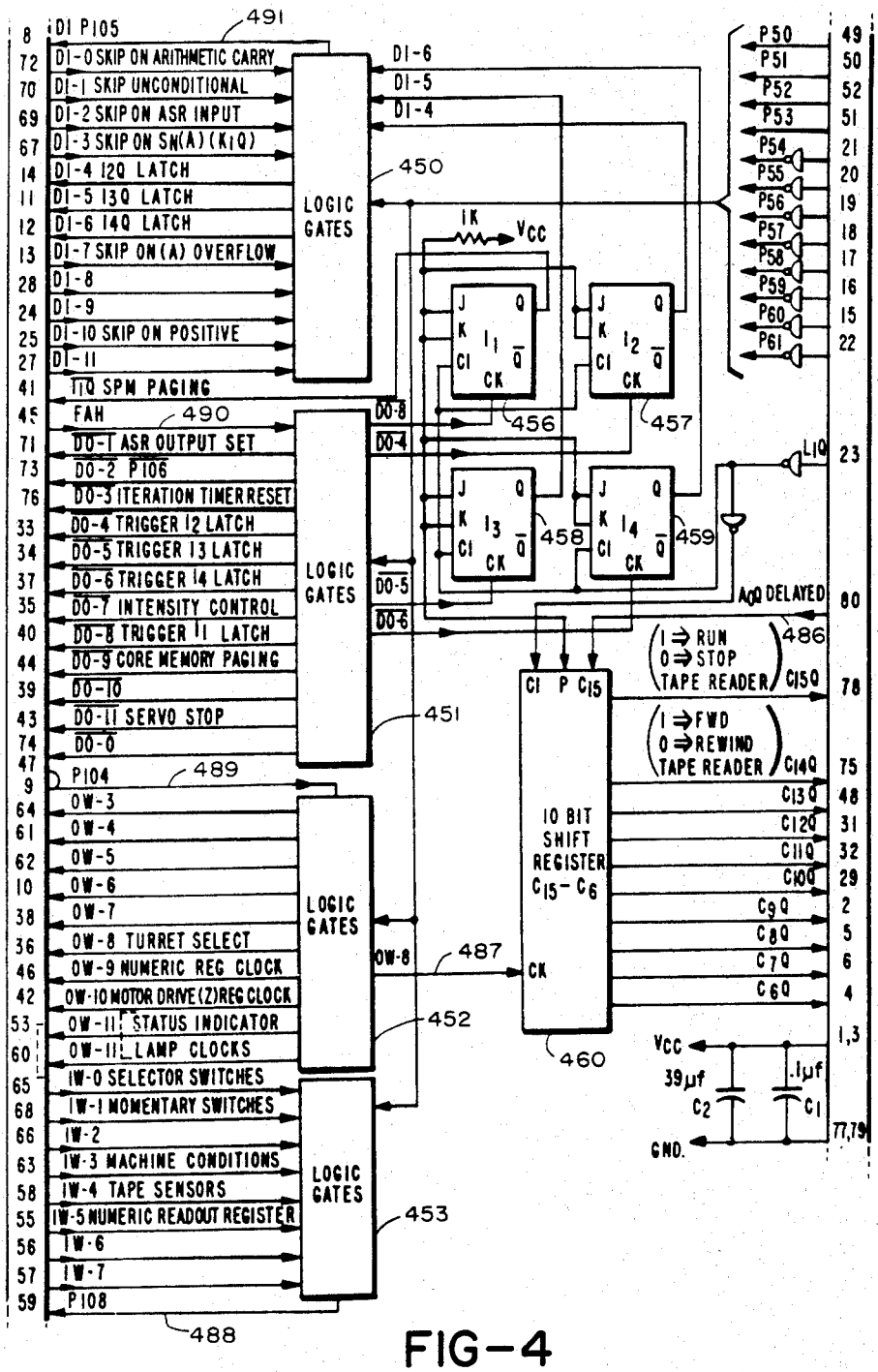
FIG. 4 is a schematic and block diagram representation of the IFA-1 circuit board.

As shown in FIG. 4, the IFA-1 printed circuit board contains logic gates 450, 451, 452 and 453 providing input/output functions. The IFA-1 board accepts input and output type instruction micro-operation signals as well as address signals to encode or decode the various inputs and outputs. The input and output words are exchanged with the A-register in the data processor. The input words (IW) are multiplexed by logic gates 453 into signal P108 which is input to the A-register. Information is output from the A-register to the various entities by connecting the entities to $A_0Q$ and clocking a selected entity with a gated clock P104 as determined by logic gates 452, shown as output word (OW) signals. Discrete input signals (DI) are multiplexed into a signal P105 by logic gates 450. Discrete output signals (DO) are decoded and gated by logic gates 451. Micro operation FAH provides the gating signal. The discrete input signals are accessed with skip on discrete decision instructions, and each discrete output signal provides a short negative going pulse when selected with a discrete output instruction. The I-register flip-flops 456, 457, 458 and 459 perform the function of latches toggled or set with the discrete outputs. The $I_1$ flip-flop 456 is used to directly provide a Scratch Pad Memory paging function. Outputs from the flip-flops $I_2$ 457, $I_3$ 458 and $I_4$ 459 become discrete inputs. A $C_1$-register 460 is loaded with output word 8 and used for general system functions. The signals P50–P61 are decoded operand addresses from the data processor.

As also shown in FIG. 4, the $C_I$-register 460 contains a plurality of discrete commands $C_{I15}Q$–$C_{I6}Q$, where the command conditions are packed together in the data processor A-register using well known programming methods. This packed word is then output to the $C_I$-register 460 with an EX-8 instruction generating the OW-8 gated clock from logic gates 452 to the clock input CK of the $C_I$ register 460. The contents of the A-register are shifted into the $C_{I15}$ input to the $C_I$ register 460 as the $A_0Q$ signal on pin 80. The data processor packs a tape reader run/stop bit into the most significant bit position corresponding to the $C_{I15}Q$ bit shown on pin 78, where a logical one commands the tape reader to run and a logical zero commands the tape reader to stop. The data processor packs a tape reader forward/rewind bit in the next most significant bit position corresponding to the $C_{I14}Q$ bit shown on pin 75, where a logical one commands the tape reader 116 to run forward and a logical zero commands the tape reader to rewind under control of the tape reader run/stop command $C_{I15}Q$ on pin 78. These tape reader controls are described in detail in the technical manual for the Remex tape reader previously referenced herein. Other discrete commands from the data processor are shown as signals $C_{I13}Q$–$C_{I6}Q$ on pins 75, 48, 31, 32, 29, 2, 5, 6, and 4 respectively and are used for controlling other system operations such as shown in FIG. 1A as machine auxiliary control signals 126A for direct control of various machine operations as described previously.

Figures 5A, 5B:
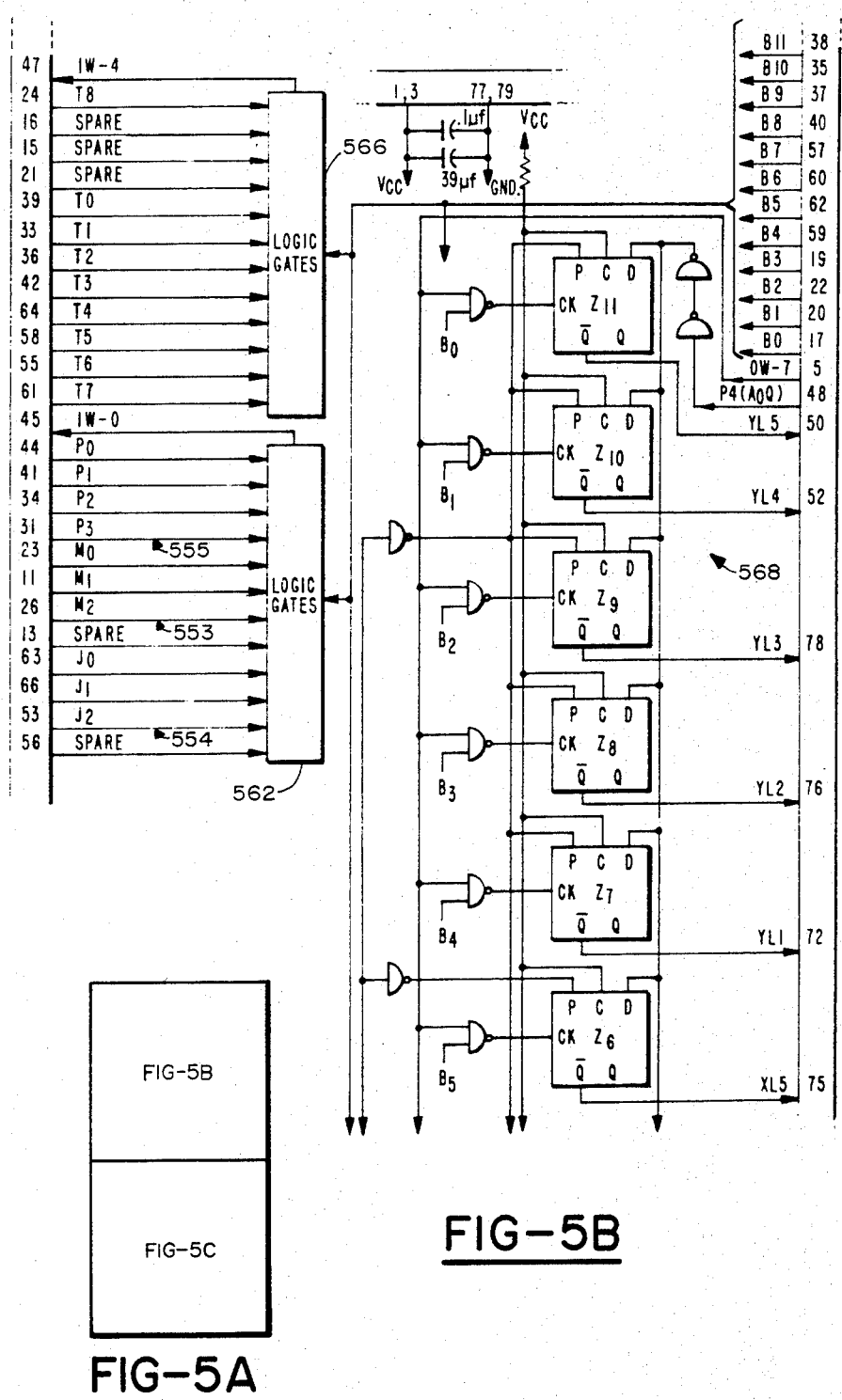
FIG. 5 is a schematic and block diagram representation of the IFA-2 circuit board, with FIG. 5A illustrating the manner in which the separate sheets of drawings of FIGS. 5B and 5C are combined to form FIG. 5.
Figure 5C:
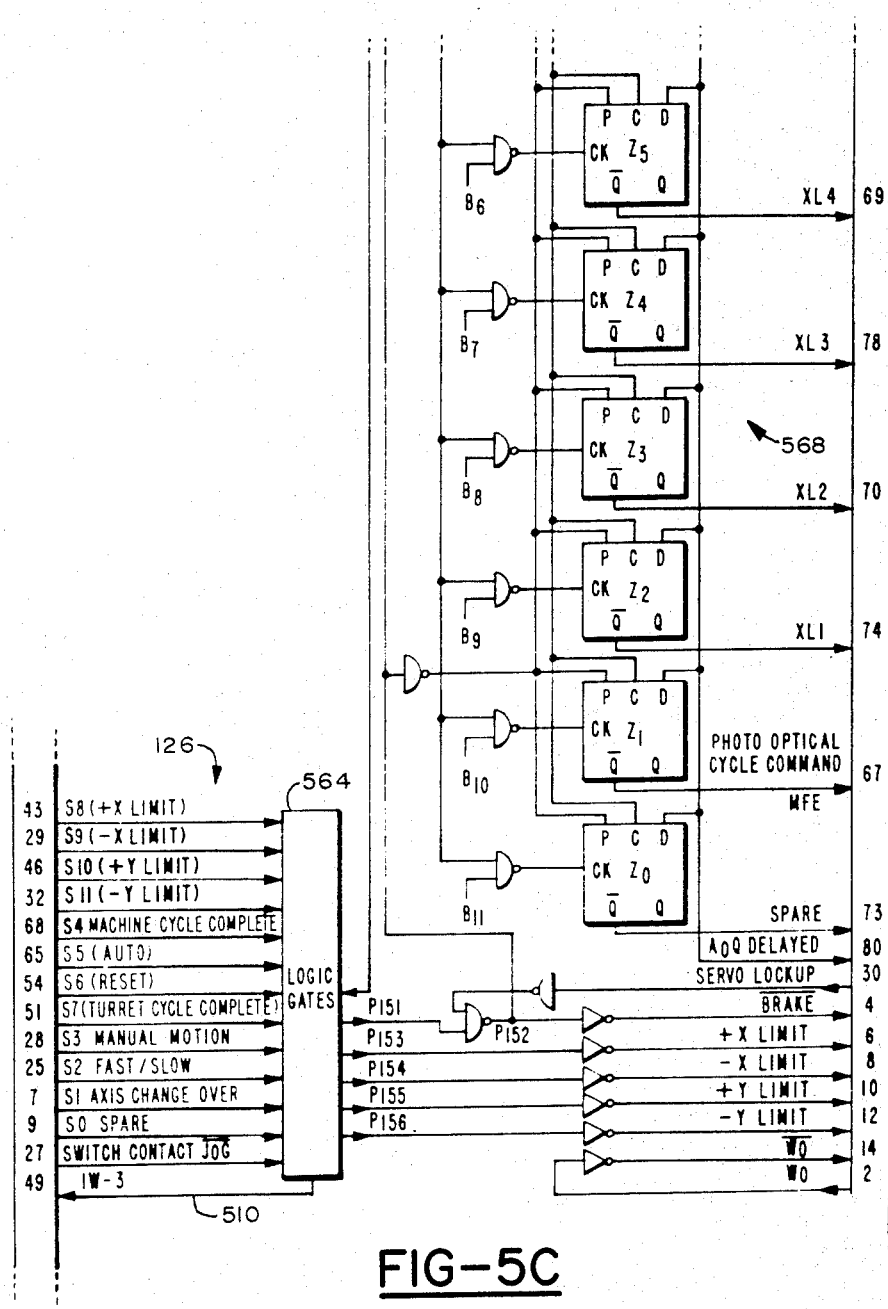

As shown in FIGS. 5B and 5B, the IFA-2 printed circuit board provides for the scan-in of input words "zero", "three", and "four" to convert the parallel input lines to a serial input that can be processed with the input word multiplexer on the IFA-1 card. Logic gates 562 scan control panel selector switch signals into input word —0, logic gates 564 scan non-system adapted machine auxiliary control signals 126B (FIG. 1A) into input word —3 and logic gates 566 scan rudimentary intrinsic tape reader input signals into input word —4. These machine auxiliary control signals are scanned into the data processor A-register with logic gates 564 as serial word IW-3 shown on pin 49 upon execution of an EX-3 instruction. Machine limit switch signals S8–S11 shown on pins 43, 29, 46 and 32 respectively are received for examination by the data processor to interlock motion. Machine Cycle Complete signal S4 shown on pin 68 is received for use by the data processor to determine if a machine command such as a discrete command has been executed to interlock machine operations. Turret cycle complete signal S7 shown on pin 51 is received by the data processor to determine if a turret command such as described herein has been executed to interlock machine operations. Operator control signals such as the Switch Contact Jog Signal shown on pin 27 is received from machine mounted operator control devices and is used in parallel with operator control devices on the panel 114 such as Jog switches 252 (FIG. 2) through interpretation by the data processor under program control as discussed previously for the switches mounted on the control panel 114 (FIG. 1A). Other machine auxiliary control signals such as signals S5, S6, S3, S2, S1 and S0 shown on pins 65, 54, 28, 25, 7, and 9 respectively are examined by the data processor to determine machine conditions.

The Z-register 568 includes flip-flops $Z_{11}$ through $Z_0$ and is a static register loaded with output word —7 to set system discrete conditions such as for machine control. It should be noted that this register does not have ambiguous outputs during the shift frame due to selective clocking of the flip-flops in this register. The Z-register 568 contains a plurality of discrete commands shown as YL5-YL1, XL5-XL1, MFE and $\overline{Z_0Q}$ which are packed together in the data processor A-register using well known programming methods. The packed word is then output to the Z-register 568 with an EX-7 instruction generating the OW-7 gated clock shown on pin 5 from logic gates 452 (FIG. 4) to clock flip-flops $Z_{11}$–$Z_0$ as selected with bit time signals shown as B0–B11 respectively to the two-input NAND gates with outputs shown connected to the clock inputs CK of the Z-register flip-flops. Discrete commands from the data processor are shown as signals YL5-YL1, XL5-XL1, MFE, and $\overline{Z_0Q}$ to pins 50, 52, 78, 76, 72, 75, 69, 78, 70, 74, 67, and 73 respectively and are used for controlling various system operations such as shown in FIG. 1A as machine auxiliary control signals 126A and 126B for direct control of various machine operations as described previously. For example, a Photo Optical Cycle Command signal MFE is shown on pin 67 to control a photo machine operation.

Figure 6:
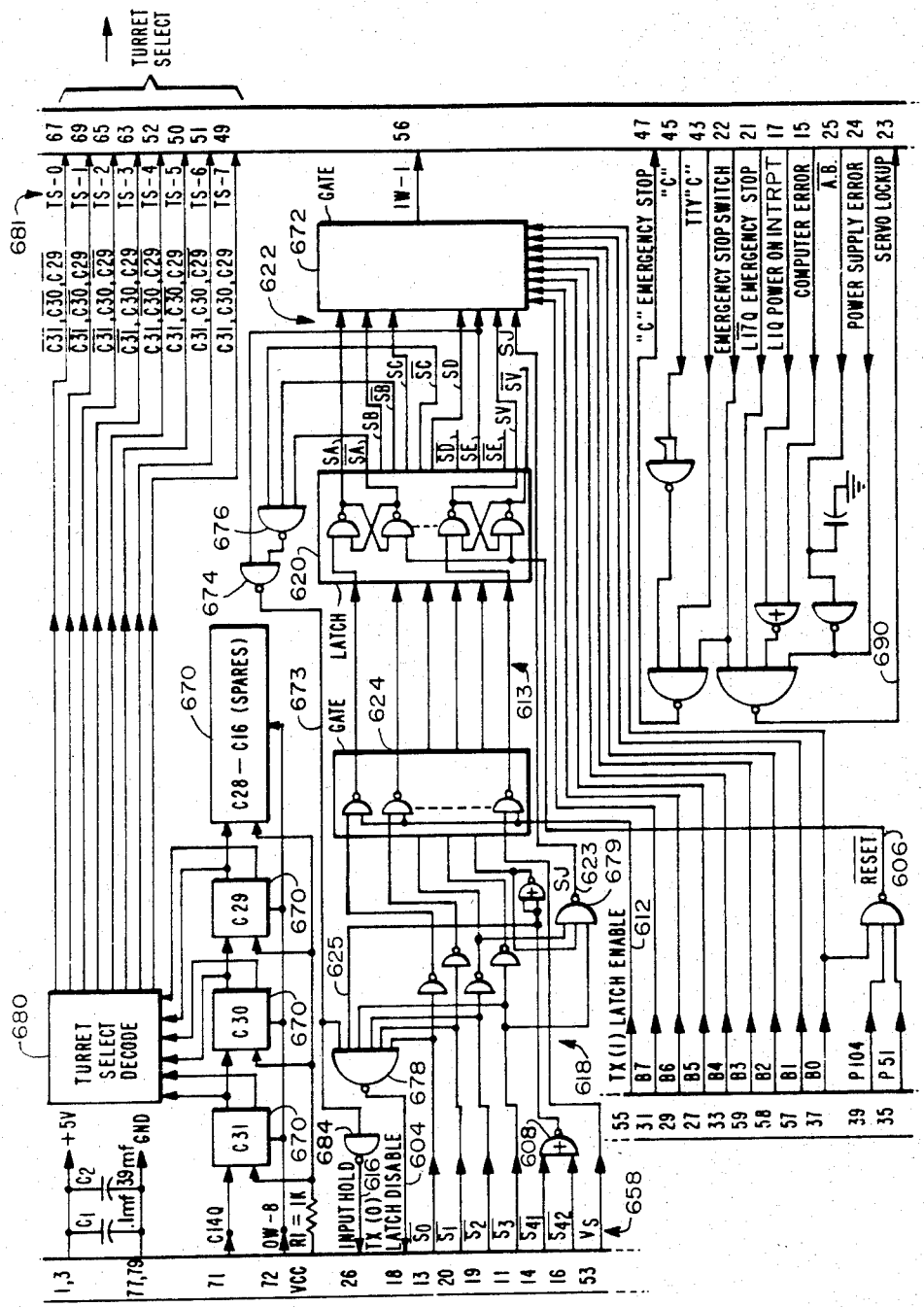
FIG. 6 is a schematic and block diagram representation of the IFA-3 circuit board.

As shown in FIG. 6, the IFA-3 printed circuit board provides an extension 670 ($C_{I31}$ through $C_{I16}$) to the $C_I$-register on IFA-1 (FIG. 4) and performs the auxiliary functions of decoding some of the discrete conditions for machine turret select 681. The data processor packs a turret select code into the word output to the $C_I$-register in positions corresponding to the $C_{I31}$, $C_{I30}$, and $C_{I29}$ stages of $C_I$-register extension 670 to excite the Turret Select Decode for generating turret select signals TS-0 through TS-7. Turret change can be enabled with discrete command signals such as previously described. The data processor can monitor the Turret Cycle Complete signal S7 on pin 51 (FIG. 5C) to determine when the turret has been properly repositioned for interlocking system operations. Logic gates 672 provide the input gating, latching and logical functions associated with the momentary switch logic inputs from the control panel and multiplex them into input word −1. In addition, special gating for computer interrupts is provided and the servo lockup signal 690 is used to disable the machine drives when a detrimental condition is sensed.

The interface assembly (IFA-1, IFA-2 and IFA-3) is not an interface in the conventional sense but constitutes a distributed group of functions that are normally associated with the data processor or the various system entities. The interface assembly also performs the function of signal distribution between the data processor and various system extremities.

Interactive Control System

Interactive control systems in accordance with the invention provide bidirectional communication between an operator and a data processing system via intermediary binary digital words. The interactive control system is an elemental extremity of the data processing system, providing unprocessed rudimentary data for a data processor and receiving preprocessed data for control of display illumination from the data processor. This elemental control system is dependent on processor coaction for performance of the task of interactive communication with an operator. The data processor operates under the control of a selected stored program to interpret input words and produce an appropriate system response, and provide output words having an appropriate format.

An elemental panel for use in systems of the type disclosed herein are processor dependent structures having means for receiving panel elements and having circuit conductors for coupling elements, and having electronic means in the conductive paths for signal processing. By this arrangement, uncommitted elements can be added or changed and the significance of given panel positions can be determined at processor option under program control without being previously committed through wired operation. The outputs of operator controllable selector switches and momentary switches are transformed to binary codes for greater efficiency. The coded outputs from the momentary switches may be gated to latches which hold the information until sampled by the data processor. Appropriate interlocks and interlock overrides may be used to control the effect of continuous depression of a momentary switch. The binary coded outputs of each selector switch and the combined momentary switch are combined to form a single intermediary input word with each binary coded output occupying a different portion of the word. The word is then sampled and interpreted by the data processor.

A display panel is composed of both lamp displays and numeric displays. Each lamp display driver is connected to a different bit of a lamp display register such that when that bit stores a binary "1" or is "set" the lamp display is lighted. The data processor provides an output word to the lamp display register comprising packed discrete lamp control bits to cause appropriate lamp displays to be lighted.

The numeric display elements may be segmented tubes, Nixie tubes, or similar devices displaying a selected character. A single numeric character display register is used to control all of the numeric displays. Output words are transferred to the numeric display register at a rapid periodic rate. One portion of these words contains a tube (element) select code identifying a particular element and a second part of the word contains a code identifying the character to be displayed. Appropriate decoding logic responsive to the numeric display register causes the appropriate segment drivers of the selected numeric display tube to be activated to display the output character. Each numeric display is then driven in turn to display a selected character. In order to refresh the numeric display at a flicker-free rate of 30 times per second, the processor places a new word in the numeric register at a cyclic rate of 30 times the number of numeric word displays desired each second. Assuming 8 numeric displays, the rate would be 240 times per second and would consume only a small part of the operating time of a modern high speed data processor.

The reduction of direct wiring connections between the interactive control system and the data processing system not only reduces manufacturing costs but provides tremendous versatility for changing system tasks to which the data processing system may be committed. Panel elements are not committed by wired connection to system circuits but are committed under program control of the data processor, providing generalized elements whose significance may be readily changed through changes in the task defining program. System controls and outputs can be varied by merely adding or deleting switches and displays and by changing associated captions in the interactive control system. Corresponding changes in data processor responses are accomplished by making appropriate changes in the stored program.

This invention provides an interactive control system establishing bidirectional communication between an operator and a data processing system. All control and data information passing between an operator and the system passes through an electronic data processor via the medium of intermediary binary digital words.

As shown in FIG. 1A an electronic data processing system 110 includes an electronic data processor 112 and an interactive control system 182. In general, the electronic data processing system may be any such system but the full advantages of this invention are best realized when used in conjunction with a system which has been committed or dedicated to a specific task or family or tasks, such as numerical control, payroll, accounting, or inventory control. It will be assumed herein, however, that the electronic data processing system 110 is committed to the task of numerical control of a milling machine.

The interactive control system 182 (FIG. 7) includes a control panel 780 as well as gates 624 and latches 620 which are physically located on available space of a printed circuit board within the electronic data processor 112 but functionally operate as part of the interactive control system 182.

Figure 2:
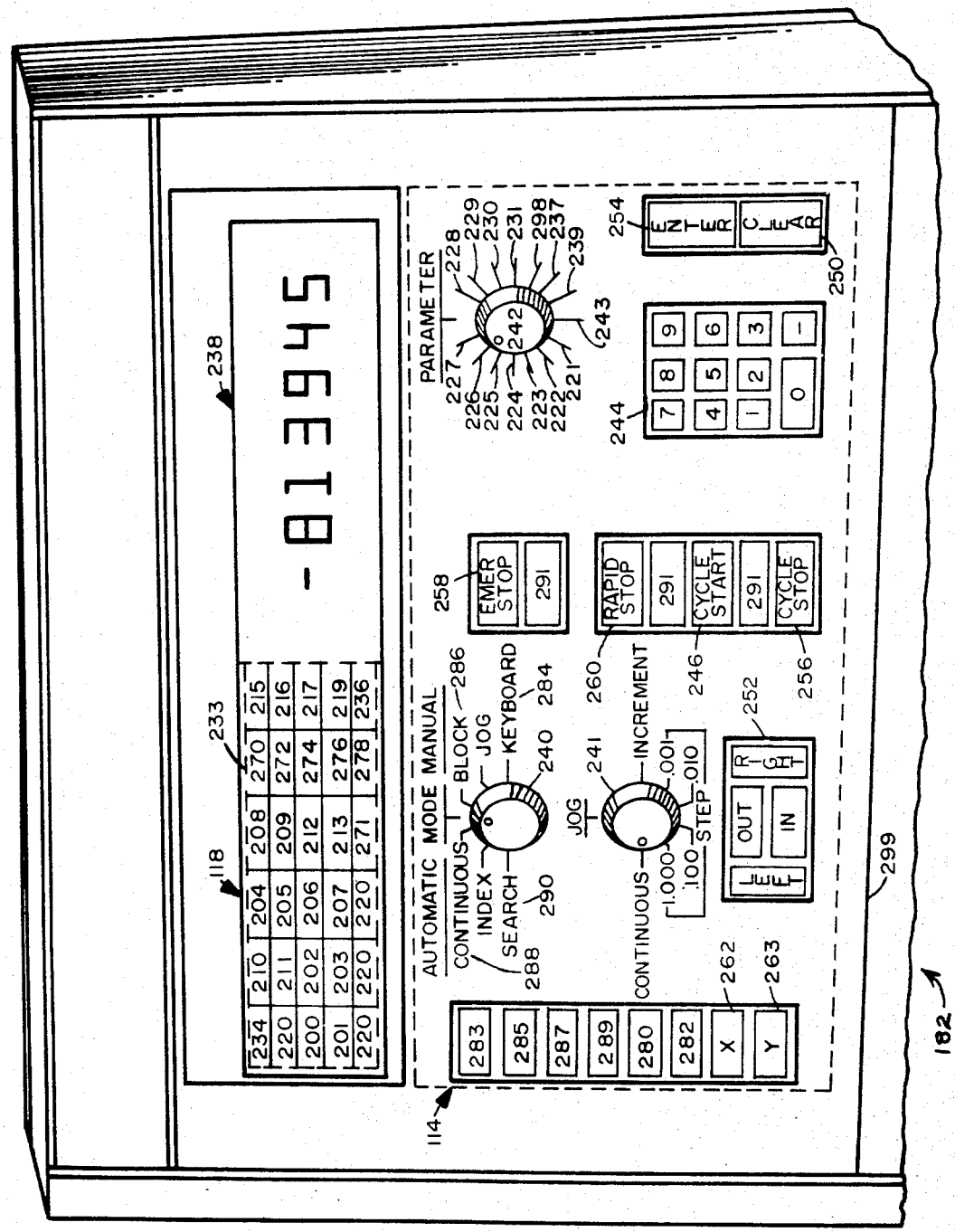
FIG. 2 is a diagram of the control panel and display panel making up part of the numerical control system of FIG. 1.

As illustrated in FIG. 2, the control panel 114 and the display panel 118 are mounted in a single rectangular plane with the display panel occupying the upper portion of the plane and the control panel occupying the lower portion of the plane. The lefthand portion of the display panel is occupied by status indicator lamp displays 233 such as the Power On indicator lamp 213 and an error indicator lamp 236. These lamp displays provide feedback to the operator by indicating system modes and conditions. All status indicator lamp displays 233 are enhanced with a special filter to suppress glare and provide an easy to read, aesthetically pleasing presentation. Displays and legends that are not illuminated are obscured behind the filter, simplifying rapid appraisal of system conditions and eliminating the need to mentally separate illuminated displays from non-illuminated but visible displays. Included within the status indicator lamp displays 233 are a bank of troubleshooting lamps such as an error indication lamp 236, which are normally obscured behind the filter, but become flashing displays if a malfunction or error should occur. The righthand portion of the display panel 118 is composed of eight numeric displays 238 which may be used to identify the magnitude of system parameters.

As described more fully in copending application "Interactive Control System", Serial No. 101,449, filed Dec. 28, 1970, by Lee et al, and incorporated herein by reference, each lamp display 233 is driven by a well known lamp driver circuit which is controlled by one bit in a lamp display register 700. The lamp display register 700 stores an intermediary output word output from the data processor 112 which defines the status of the lamp displays 233. In contrast, the numeric displays 238 are driven sequentially in accordance with an intermediary output word stored in a numeric display register 798.

Each numeric display lamp 238 is excited at a 30 cycle per second flicker free rate under program control in accordance with information contained within a numeric display register. Since the numeric display register controls the excitation of all eight numeric display tubes 238, its contents must change at a cyclic rate of 8×30=240 times per second. When an intermediary output word is clocked into the numeric display register, the first three bits select the one of eight lamps to be driven. The remaining bits within the numeric display register select the segments within the driven numeric display which are to be excited. This arrangement affords high versatility with reduced hardware. The operation of each numeric display is under program control and only one numeric display register is needed to drive all eight numeric displays.

The control panel, which is also described in copending application Interactive Control System, Ser. No. 101,449, filed Dec. 28, 1970, by Lee et al, has three selector switches and a plurality of momentary switches as shown in FIG. 2. The three selector switches, a Mode switch 240, a Jog switch 241 and a Parameter switch 242, are multiple position rotary switches. The Mode selector switch 40 defines one of the six operating modes of the system, the Jog switch 241 defines the machine displacement for each jog command executed when in the jog mode, and the Parameter switch 242 defines the parameter to be displayed on the numeric displays 238 and, when in the keyboard mode, defines the address of the parameter to be entered through the keyboard 244. The remaining switches are momentary switches which maintain contact only so long as they are held down. The Mode selector switch 240 defines the major operating conditions of the system which are: (1) Search, (2) Index, (3) Continuous, (4) Block, (5) Jog, and (6) Keyboard. The Search position 290 of the Mode selector switch 240 permits an operator to identify a desired part program block of commands from a punched tape or from a self-contained parts program memory such as the core memory 130 in systems where this capability is provided, and then initiate an automatic search for that block of commands. A sequence number, which is used to identify the selected block of commands, is entered through a keyboard 244 made up of momentary switches. The number which is entered through the keyboard 244 is displayed on the numeric displays 238 to permit the operator to verify the number which has been entered.

The numerical control system 110 uses a zero synchronization or index point with respect to which all positions of the machine tool are defined. The Index position of the Mode selector switch 240 causes the machine tool to return to the previously defined index point. When in the index mode, depression of the Cycle Start switch 246 will cause the numerical control system 110 to drive the machine tool precisely to the index point.

The Continuous position of the Mode selector switch 240 is used only after system initialization and initial work piece setup. Depression of the Cycle Start button 246 while in the Continuous mode initiates fully automatic operation as commanded by the part program from the tape reader 116 or other source of part programs.

The Block position 286 of the Mode selector switch 240 permits an operator to control the numerical control system 110 in a semi-automatic mode for operations such as part program checkout. In this mode, the system will access a single block of commands from a part program, execute those commands, and then enter the Cycle Stop condition. When in this mode, a part program can be executed one block at a time by refraining from depressing the Cycle Start switch 246 until subsequent to the completion of execution of the previous block of commands.

The Keyboard position 284 of the Mode selector switch 240 permits operator control of the system in a semi-automatic mode. A block of part program commands can be entered through the keyboard 244, and then executed when the Cycle Start switch 246 is depressed. When commands are loaded through the keyboard the parameters will automatically appear on the numeric displays 238. Data input errors can be easily corrected by depressing a Clear switch 250 and reentering the parameter through the Keyboard.

The Jog position of the Mode selector switch permits an operator to reposition the machine tool in a semi-automatic manner for operations such as initial work piece setup or index definition. The Jog selector switch 241 and the Jog Direction switches 252 may be used by the operator to conveniently reposition the machine tool. With these basic controls, the machine can be positioned precisely to within the resolution of a system (0.0005 inch) with a minimum of effort, fixtures, readouts, and optics. The numerical control system 110 executes precision positioning commands in accordance with the distances and directions selected without burdening the operator with tedious measuring functions. In addition, the numeric displays 238 will show the machine position for positive verification while in this mode.

The Jog selector switch 241 becomes operative only when the Mode selector switch 240 is in the Jog position, and defines the machine displacement for each jog command executed. The selectable positions are: (1) Continuous, (2) 1.0000 inch step, (3) 0.1000 inch step, (4) 0.0100 inch step, (5) 0.0010 inch step, (6) Increment.

The Continuous position of the Jog selector switch 241 will cause the system to drive continuously in a direction commanded by one of four Jog Direction switches 252. These direction switches cause the machine tool to move left, right, in, or out depending upon which one of the four switches is depressed. While in the Continuous Jog position, the machine tool is driven continuously in the commanded direction for the duration of time that a Jog Direction switch is maintained in a depressed state. Electronic detents are implemented causing the machine to decelerate and accelerate subsequent to each one inch of translation of the machine tool. This action graphically defines and permits the operator to observe the magnitude of motion for convenient operation. In addition, continuous jogging will always terminate a precise number of inches from the starting point for accurate control of displacement.

The four step positions of the Jog selector switch cause the system to drive the machine tool a precise step distance selected each time a Jog Direction switch is depressed.

The Increment position of the Jog selector switch 241 causes the system to drive the machine tool a single precise least significant increment of distance each time a Jog Direction switch 252 is depressed, 0.0005 inch in this embodiment of the invention. When in the Step or Increment positions, regardless of whether the Jog direction switch is maintained in a depressed state for an instant or continuously, the machine will still execute only the single commanded step and then halt. Additional motion can only be initiated by releasing and again depressing a Jog Direction switch 252. This eliminates the need for rapid operator response, since the precise step commanded will be executed independent of the duration of time that a direction switch 252 is depressed.

The position of the Parameter selector switch 242 defines the parameter to be displayed on the numeric displays and, when the Mode selector switch 240 is in the Keyboard position, the block of commands being entered through the keyboard 244 is displayed. The selectable parameters for this numerical control system 10 are: (1) Sequence No. —N, (2) Absolute Position —X, (3) Absolute Position —Y, (4) Arc Center —I, (5) Arc Center —J, (6) Auxiliary Command —M, (7) Auxiliary Command —G.

The Sequence Number position causes the numeric displays 238 to show the address of a block of punched tape commands being read from the punched tape while in the Continuous or Block mode. The Sequence Number position of the Parameter selector switch 242 also causes the numeric displays 238 to show the sequence number being entered through the keyboard 244 while the Mode selector switch is in the Keyboard position. This is done prior to initiating a tape search in the Search mode.

The Absolute Position location of the Parameter selector switch 242 causes the numeric displays 238 to monitor the position of the machine tool relative to the floating zero or index point. When the Mode selector switch 240 is in the Keyboard location and the Parameter selector switch 242 is in one of the Position locations, the system enters and the numeric displays 238 show the position commanded by the operator to be entered through the keyboard 244. For instance, suppose the operator wishes to position the machine tool at an X coordinate of 05.6000. To do this, he turns the Mode selector switch 240 to the Keyboard position and the Parameter selector switch 242 to the Absolute Position X, and then enters the numbers 05.6000 through the keyboard 244. At this point, the numeric displays 238 are showing the number 05.6000 and the system is ready to move the machine tool to this X position when the Mode selector switch 240 is in the Keyboard location and the Cycle Start button 246 is depressed.

In similar manner the Arc Center and Auxiliary Command locations of the Parameter selector switch 242 are used in the Keyboard mode to enter the commands from the keyboard.

There are several momentary switches in addition to the Keyboard switches 244, Cycle Start switch 246, Jog Direction switches 252 and Clear switch 250 whose functions have previously been described. All of the momentary switches are hermetically sealed reed relay switches. A latching interlock is provided, making the system insensitive to dynamic switch conditions such as switch bounce. In addition, operation is independent of operator action such as the duration of switch depression and additional switch commands which might result in ambiguities are automatically locked out as long as one of the momentary switches remains depressed.

For operator convenience the momentary switches are grouped into functional arrays, for example, the Keyboard switches 244 and the Jog Direction switches 252.

The keyboard 244 is composed of ten numeric keys defined as 0 through 9 and a negative sign key. The zero key can be used for the plus sign when required. The numeric and sign keys of the keyboard 244 are used to enter data in the Keyboard mode and a Clear key 250 adjacent to the keyboard 244 blanks the numeric displays 238 prior to the entering of the data. An Enter key 254 causes a parameter to be accepted by the numeric control system after it has been entered through the keyboard 244 and verified by the operator's observation of the numeric display 238. In the Keyboard mode the various parameters can be varied or entered as required. Parameter verification is achieved by rotating the parameter selector switch 242 to the respective position and monitoring the numeric display 238. Parameter modification is accomplished by depressing the Clear key 250, resulting in the blanking of the numeric display 238, and the sequential depression of the sign and numeric keys of the keyboard 244, resulting in a presentation on the numeric display 238 of the newly keyed numbers. The entered parameter will automatically be accepted by the computer for processing and for display under program control.

The Cycle Start switch 246 and the Cycle Stop switch 256 are used to initiate or terminate automatic operation, respectively. When in the cycle off condition, as identified by the Cycle Off status indicator lamp 271, the operator can initiate automatic operation by depressing the Cycle Start switch 246. The system will automatically execute commands until detecting a condition that defines cycle stop which is:

(1) In the Search mode, detecting the required tape location.

(2) In the Index mode, repositioning the machine to the floating zero point.

(3) In the Continuous mode, completing the execution of a block of tape commands in response to appropriate G or M commands contained therein, or if the operator has depressed the Cycle stop switch 256.

(4) In the Block mode, completing the execution of a single block of tape commands.

(5) In the Jog mode, completing execution of the jog command.

(6) In the Keyboard mode, completing execution of a single block of keyboard commands.

When in the Continuous mode with the cycle on condition as identified by the Cycle On status indicator lamp, the operator can discontinue automatic operation by depressing the Cycle Stop switch 256. The system will complete the execution of the block of commands in process and then enter the cycle off condition as identified by the Cycle Off lamp.

When the system is in a mode other than the continuous mode with the cycle on condition, it is not necessary for the operator to depress the Cycle Stop switch to discontinue automatic operation, because all modes other than the Continuous mode execute a single set of commands and then automatically enter the cycle off condition. An Emergency Stop switch 258 is used to discontinue automatic operation rapidly and to force the system into a reinitialization condition. It will then be necessary to perform the system initialization sequence prior to operating the system. The system initialization sequence involves:

(1) position the Mode selector switch 240 to the Jog position.

(2) jog the machine tool to the index position.

(3) position the Mode selector switch 240 to the Index location.

(4) depress the Cycle Start switch 246 to load the index position of the machine tool.

(5) if required, load the punched tape in the tape reader 116.

The Jog Direction switches 252 are used by the operator to define the direction of motion and to initiate this motion, but only if the system is in the Jog mode. In addition, the position of the Jog selector switch 241 will define the type of motion, i.e. Continuous, Step, or Increment. The jog directions of (1) Right, (2) Left, (3) In, and (4) Out, are defined by facing the machine from the control panel side.

The rapid stop switch 260 causes all machine motion to stop immediately, but permits operation to be resumed with the Cycle Start switch.

A pair of Mirror Image switches 262, 263 are used to selectively reverse the commanded directions of motion. Alternate depression of the X or Y mirror image switches 262, 263, respectively, will cause the mirror image status indicator lamps contained in the bank of lamp displays 233 to change state from $+X$ or $+Y$ to $-X$ or $-Y$ and conversely. The operational condition presented on the mirror image status indicator lamps defines to the operator system conditions.

The control switches of the control panel are not hard wired directly into the control panel lamps and other functions. Instead, the central data processor periodically samples the status of the various switches under program control. The data processor then further acts under program control to operate the various entities of the system in accordance with the status of the control switches. Because the switches are sampled in this way as opposed to being hard wired, the basic numerical control system can be used for a different but related application by merely providing different extremities, changing the designations associated with the various switches, and changing the program which interprets the various switch positions and causes the system to react accordingly. In addition, existing switches can be easily deleted or, if desired, spare capacity permits the addition of either extra momentary switches or extra selector switches or even additional positions of existing selector switches.

In order to reduce the number of wiring connections and facilitate convenient processing, the individual switches and switch positions are first encoded into a binary format before being presented to the central processor 112. The six positions of the Mode selector switch 240 are encoded into three binary bits as follows:

TABLE I

| M2 | M1 | M0 | |
|---|---|---|---|
| 0 | 0 | 0 | Spare |
| 0 | 0 | 1 | Block |
| 0 | 1 | 0 | Continuous |
| 0 | 1 | 1 | Search |
| 1 | 0 | 0 | Keyboard |
| 1 | 0 | 1 | Jog |
| 1 | 1 | 0 | Index |
| 1 | 1 | 1 | Spare |

Similarly, the six locations of the Jog selector switch 241 are encoded as follows:

TABLE II

| J2 | J1 | J0 | |
|---|---|---|---|
| 0 | 0 | 0 | Spare |
| 0 | 0 | 1 | Continuous |
| 0 | 1 | 0 | 1.000 inch |
| 0 | 1 | 1 | 0.100 inch |
| 1 | 0 | 0 | 0.010 inch |
| 1 | 0 | 1 | 0.001 inch |
| 1 | 1 | 0 | Increment |
| 1 | 1 | 1 | Spare |

The seven positions of the Parameter selector switch 242 are encoded into four binary bits as follows:

TABLE III

| P3 | P2 | P1 | P0 | |
|---|---|---|---|---|
| 0 | 0 | 0 | 0 | Spare |
| 0 | 0 | 0 | 1 | X-Position |
| 0 | 0 | 1 | 0 | Y-Position |
| 0 | 0 | 1 | 1 | Spare |
| 0 | 1 | 0 | 0 | Spare |
| 0 | 1 | 0 | 1 | I-Arc Center |
| 0 | 1 | 1 | 0 | J-Arc Center |
| 0 | 1 | 1 | 1 | Spare |
| 1 | 0 | 0 | 0 | Spare |
| 1 | 0 | 0 | 1 | M-Auxiliary Command |
| 1 | 0 | 1 | 0 | G-Auxiliary Command |
| 1 | 0 | 1 | 1 | Spare |
| 1 | 1 | 0 | 0 | Spare |
| 1 | 1 | 0 | 1 | Spare |
| 1 | 1 | 1 | 0 | Spare |
| 1 | 1 | 1 | 1 | Spare |

In a similar manner, all of the momentary switches are encoded into five binary bits designated S0, S1, S2, S3 and S4. These five bits can accommodate up to 31 momentary switches. In addition, a sixth bit, $V_s$ provides a verify function for the stop switches.

The encoded selector switch bits are then combined into a single sixteen bit word having the format of P3, P2, P1, P0, Spare, J2, J1, J0, M2, M1, M0, Spare, and four zero states shown in FIG. 5B with logic gates 562. This word is serially scanned into the central processor 112 with logic gates 562 whenever the selector switches are to be sampled under program control. Similarly, the encoded outputs of the momentary switches make up a separate word which is periodically sampled under program control with logic gates 562 shown in FIG. 5B.

Figure 7:
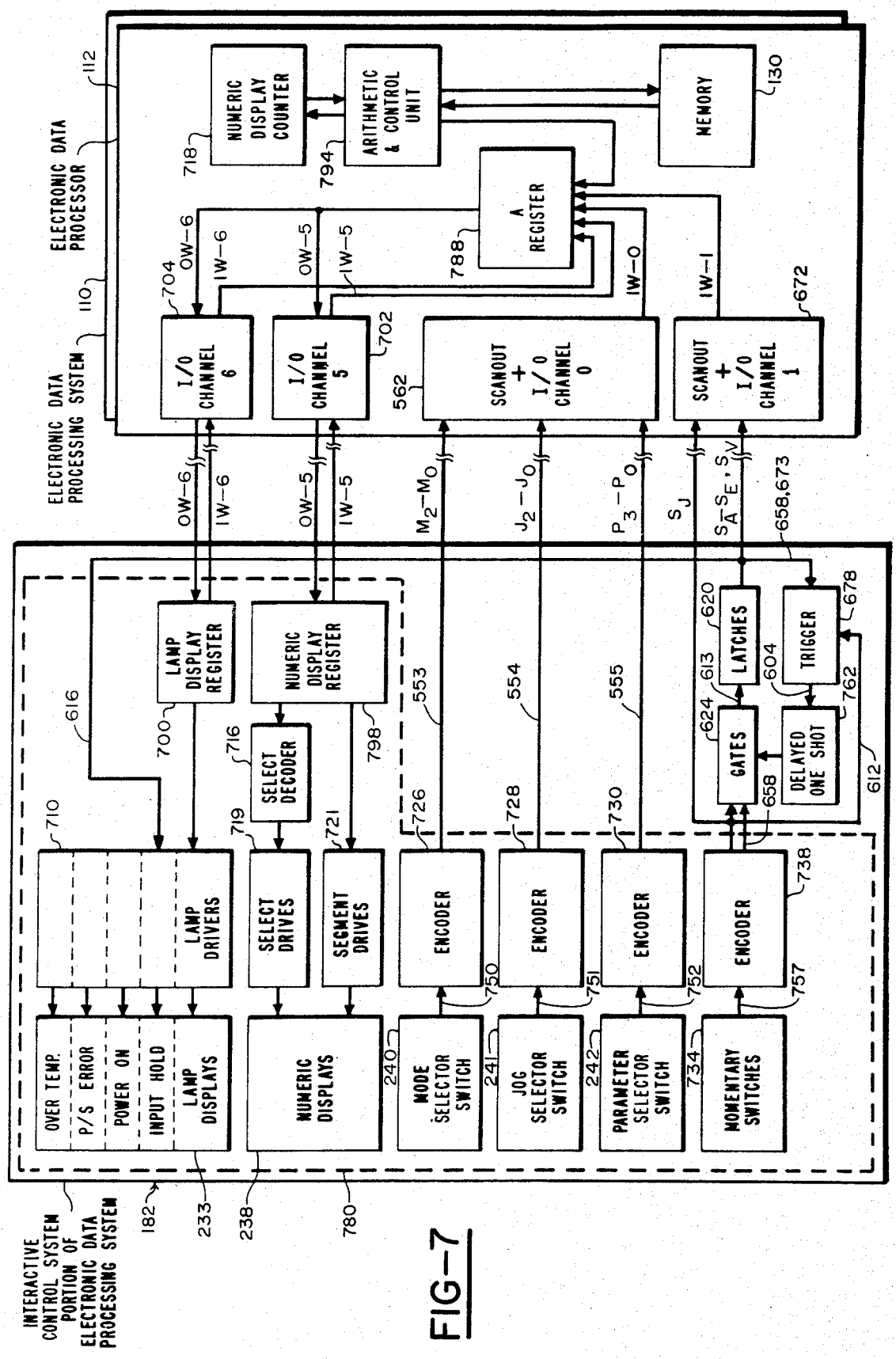
FIG. 7 is a block diagram representation of an interactive operator control system.

As shown in FIG. 7 a master panel board 182 supports components and circuits, including a display portion 118 of the control system. The panel board 780 may be a printed circuit board having conventional spaced apart apertures or receptacles 836 (FIG. 8) on the front side into which selector switches and momentary switches may be inserted. Printed circuit wiring to each of the element positions and a minimal amount of electronic circuitry is mounted on the back of the panel board 780 to facilitate error free communication with the data processor. By placing this circuitry in close proximity to the switches and displays, signal lines are held to a minimum length, thereby minimizing costs and errors.

Three multi-position selector switches, a mode selector switch 240, a jog selector switch 241 and a parameter selector switch 242 provide primarily control type functions. Because hardwiring of switch controls is avoided by having intermediary output words communicated to and interpreted by the data processor, the number of selector switches as well as the number of contacts on each selector switch can be easily varied to meet the requirements of a specific application. In this embodiment the interactive control system can accommodate a maximum of 4 selector switches, each having 15 positions. However, even the 7 switch positions on the mode selector switch 240 and the jog selector switch 241 and the 15 switch positions on the parameter selector switch 242, are not fully used in this application.

Figure 8:
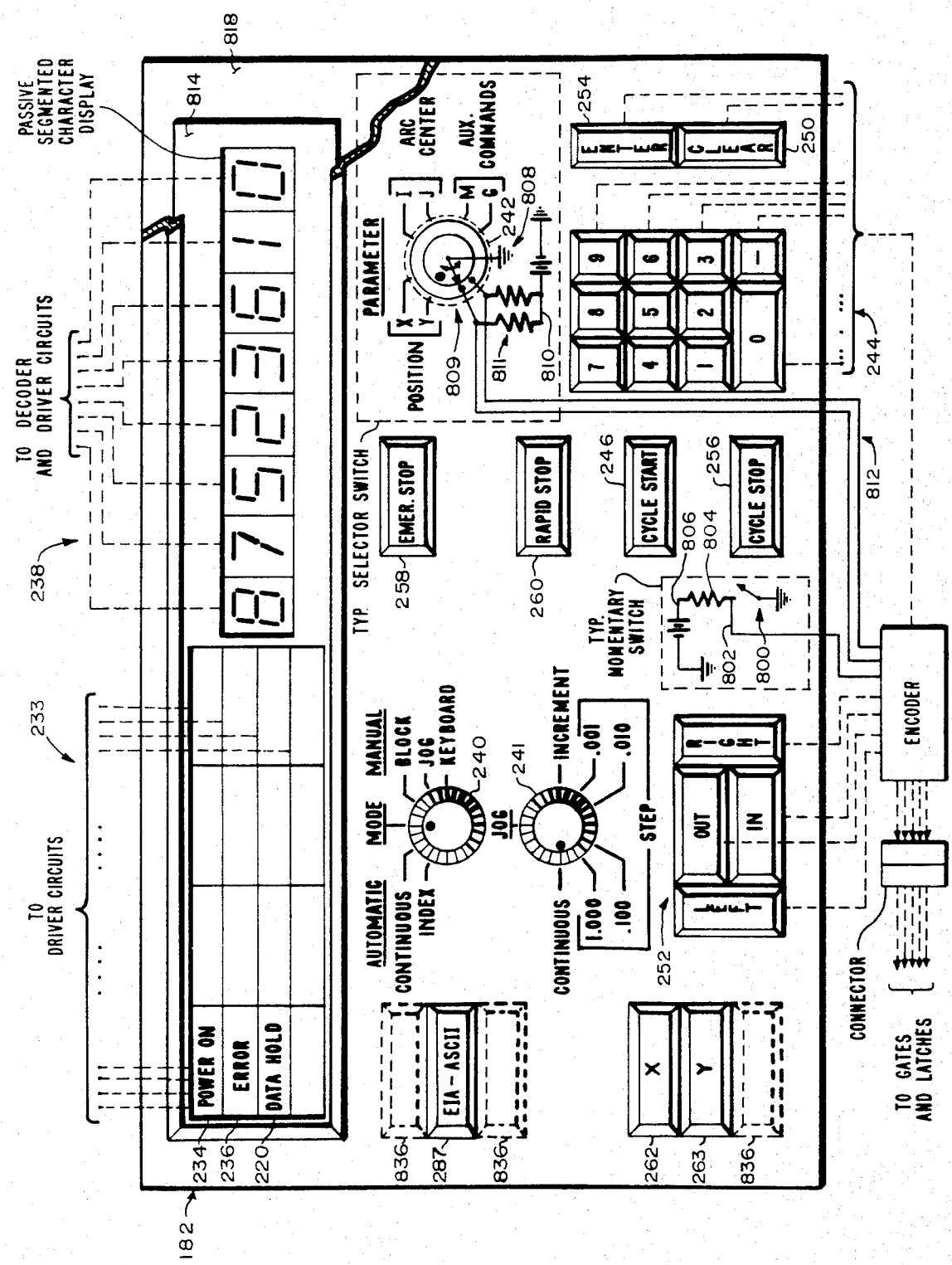
FIG. 8 is a front view, partly broken away, of an operator panel board.

The selector switches are implemented by grounding the wiper arm 808 and connecting each switch contact 809 to a positive voltage 810 through a resistor 811 (FIG. 8). This arrangement causes the signals from the contact outputs 809 to represent the inverse of the selector switch position, a condition particularly suitable to modern integrated circuit logic gates.

As shown generally in FIG. 7 the 7 signals from the contacts of the mode selector switch 240 and the 7 signals from the contacts of the jog selector switch 241 are each converted by encoders 726 and 728 respectively, into 3-bit binary coded signals. Similarly, the 15 signals from the contacts of the parameter selector switch 242 are converted by an encoder 730 to 4-bit binary coded signals. These encoded signals are connected to Scanout and I/O Channel-0 562 which converts the parallel signals to a serial intermediary binary digital word as they are shifted into the A-Register 788 of the data processor 112.

Although each of the decoders 726, 778, and 730 can accommodate one more input signal, the binary coded output represented by all zeros is not implemented to permit the data processor to detect a switching error. If the wiper arm of a selector switch 240, 241, or 242 is between contacts or fails to make proper contact with a contact the associated encoder 726, 728 or 730 provides an all zero output. The data processor 112 interprets an all zero output as an error condition and causes an "error" display lamp to be illuminated after a short delay to allow for normal switching time.

Referring now to FIG. 8, 24 momentary switches typified by switches 262 are shown mounted on the panel board 780. As with the selector switches, the number of momentary switches can be easily varied to meet the requirements of a specific application. The circuitry of the present embodiment can accommodate up to 31 momentary switches with locations for possible additional switches represented by dotted outlines 836.

Reed switches which are mounted in apertures in the panel board 780 are used exclusively in the preferred embodiment for the momentary switches to insure the highest level of reliability, versatility and cost effectiveness, but other well known switches may also be used. As with the selector switches, the momentary switches are implemented by grounding the wiper contacts 800 and connecting the stationary contacts through a pull down resistor 804 to a positive voltage 806.

Figure 9:
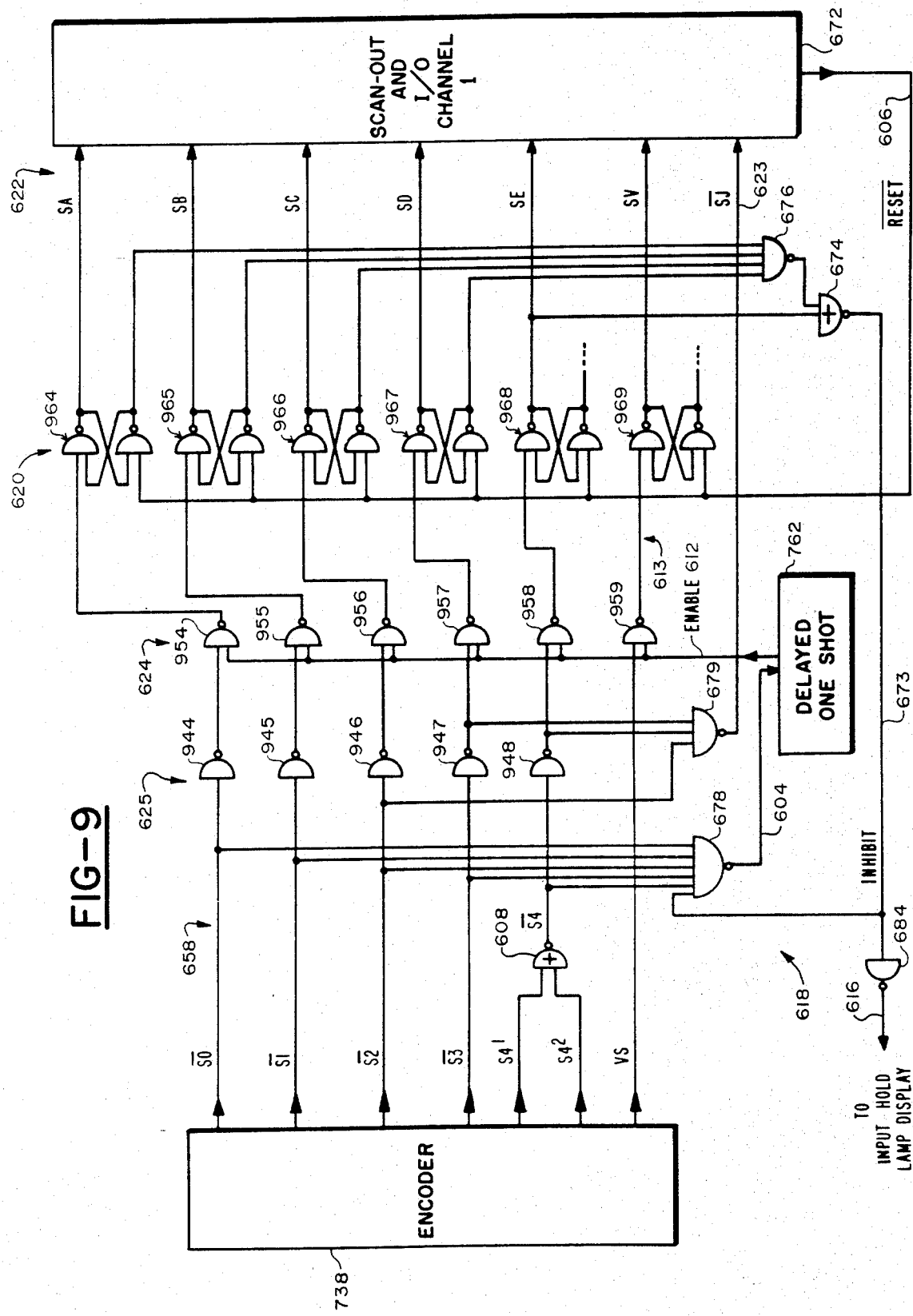
FIG. 9 is a block diagram and logical diagram representation of operator panel logic.

As shown in FIGS. 7 and 9, the 31 unitary outputs are converted by an encoder 738 to a 5-bit binary coded signal, thereby reducing the number of transfer lines to minimize interconnections and circuitry. The five binary signals are $\overline{S_0}$ through $\overline{S_4}$ with two partial signals $S_4'$ and $S_4^2$ being NORed together to form the total S4 signal. In addition, a sixth signal Vs performs a verify function by indicating depression of either a rapid stop switch 260 or an emergency stop switch 258 (FIG. 8). The signals $\overline{S_0}$ through $\overline{S_4}$ are connected through inverting logic gates 944–948 to logic gates 954–958 respectively. The signal Vs is connected directly to logic gate 959. The logic gates 954–959 pass the signals $S_0$–$S_4$ and Vs on to latches 964–969 respectively only when an enable signal is received from a delayed one shot 762.

The latches 964–969 permit the data processor to sample the intermediary binary digital output word represented by the latch outputs at a rate of 10 times each second. This rate is sufficiently high to avoid inconvenience to an operator who may not depress a subsequent momentary switch until the output from a previously depressed momentary switch has been sampled by the data processor which resets the latches 964–969 with reset signal upon completion of the sampling operation.

A system of lockouts and lockout overrides is used to minimize errors while still permitting the interactive control system to accomplish all necessary functions. An inhibit signal 673 is produced by logic gates 674 and 676 which are connected to latches 964–968 and produce an inhibit signal 973 whenever any of the latches are set. The latch 969 which latches the Vs stop verify operates independent of the inhibit signal. The inhibit signal is connected to a NAND gate 678 which provides a trigger signal to the delayed one shot 762 as an output. The gate 678 is also connected to binary signals $\overline{S_0}$–$\overline{S_4}$ and produces a trigger signal only when a signal is produced on at least one of the binary outputs $\overline{S_0}$–$S_4$ subsequent to a condition in which there is no inhibit signal and no signal on any of the binary outputs $\overline{S_0}$–$\overline{S_4}$. In other words, the output of a subsequent momentary switch cannot be gated and latched until the latches 964–968 have been reset and all previously depressed momentary switches have been released.

The delayed one shot 762 produces a 3μS pulse following a 10 ms delay. The 10 ms delay permits transient switching conditions such as switch bounce inherent in all momentary switches to subside before the binary outputs $S_0$–$S_4$ and $V_S$ are gated to the latches. Thus, the lockout arrangement not only prevents errors created by the depression of more than one momentary switch but also prevents errors due to transient switching conditions.

A special signal is provided by NAND gate 679 which produces a signal on output $\overline{S_J}$ whenever the condition $S_4 \cdot S_3 \cdot \overline{S_2}$ exists. The signal $\overline{S_J}$ forms a part of the intermediary binary digital output word but bypasses the gates 954–959 and latches 964–969. The signal $S_J$ indicates depression of one of the jog direction switches, left, right, in or out. This permits the data processor to identify if a jog direction switch is maintained in the depressed state for the jog continuous condition.

The inhibit signal 673 inverted by a NAND gate 684 to provide a data hold signal 616. This data hold signal controls a data hold lamp display 220 (FIG. 8) which becomes illuminated to indicate a set condition of one of the latches 964–968. As long as the input hold lamp display is illuminated the operator knows he should not depress another momentary switch. The binary codes for the momentary switches are presented in Table IV.

TABLE IV

| $V_S$ | $S_4$ | $S_3$ | $S_2$ | $S_1$ | $S_0$ | |
|---|---|---|---|---|---|---|
| 0 | 0 | 0 | 0 | 0 | 0 | Spare-0 |
| 0 | 0 | 0 | 0 | 0 | 1 | Keyboard 0 |
| 0 | 0 | 0 | 0 | 1 | 0 | Keyboard 1 |
| 0 | 0 | 0 | 0 | 1 | 1 | Keyboard 2 |
| 0 | 0 | 0 | 1 | 0 | 0 | Keyboard 3 |
| 0 | 0 | 0 | 1 | 0 | 1 | Keyboard 4 |
| 0 | 0 | 0 | 1 | 1 | 0 | Keyboard 5 |
| 0 | 0 | 0 | 1 | 1 | 1 | Keyboard 6 |
| 0 | 0 | 1 | 0 | 0 | 0 | Keyboard 7 |
| 0 | 0 | 1 | 0 | 0 | 1 | Keyboard 8 |
| 0 | 0 | 1 | 0 | 1 | 0 | Keyboard 9 |
| 0 | 0 | 1 | 0 | 1 | 1 | Keyboard Clear |
| 0 | 0 | 1 | 1 | 0 | 0 | Keyboard Enter |
| 0 | 0 | 1 | 1 | 0 | 1 | Spare-13 |
| 0 | 0 | 1 | 1 | 1 | 0 | Spare-14 |
| 0 | 0 | 1 | 1 | 1 | 1 | X |
| 0 | 1 | 0 | 0 | 0 | 0 | Y |
| 0 | 1 | 0 | 0 | 0 | 1 | Spare-17 |
| 0 | 1 | 0 | 0 | 1 | 0 | Spare-18 |
| 0 | 1 | 0 | 0 | 1 | 1 | Cycle Start |
| 0 | 1 | 0 | 1 | 0 | 0 | Cycle Stop |
| 1 | 1 | 0 | 1 | 0 | 1 | Rapid Stop |
| 1 | 1 | 0 | 1 | 1 | 0 | Emergency Stop |
| 0 | 1 | 0 | 1 | 1 | 1 | Spare-23 |
| 0 | 1 | 1 | 0 | 0 | 0 | In |
| 0 | 1 | 1 | 0 | 0 | 1 | Out |
| 0 | 1 | 1 | 0 | 1 | 0 | Left |
| 0 | 1 | 1 | 0 | 1 | 1 | Right |
| 0 | 1 | 1 | 1 | 0 | 0 | Spare-28 |
| 0 | 1 | 1 | 1 | 0 | 1 | Spare-29 |
| 0 | 1 | 1 | 1 | 1 | 0 | Spare-30 |
| 0 | 1 | 1 | 1 | 1 | 1 | Spare-31 |

Referring now to FIG. 7, the binary coded outputs from the three selector switches 240, 241, 242 are combined to form a single intermediary binary digital input word which is shifted into the A-Register 788 of the data processor through Scanout and I/O Channel-0 562. Similarly, the outputs from the momentary switches are used to form an intermediary binary digital output word which is shifted into the A-Register through Scanout and I/O Channel-1 672.

Once an intermediary input word is within the A-Register it is manipulated and interpreted by an arithmetic and control unit 794 operating under control of program instructions stored in a memory 130. After an input word has been interpreted, the data processor generates appropriate system responses.

The data processor also generates preprocessed intermediary output words having selected formats and transfers them from the A-Register to a numeric display register 798 and a lamp display register 700 through I/O Channel-5 702 and I/O Channel-6 704, respectively. These channels provide bidirectional communication of intermediary output words with the A-Register, permitting previously output words to be returned to the A-Register to check for errors occurring during transmission. The interpretation and processing of intermediary words takes place within the data processor.

The displays include both lamp displays 233 and numeric displays 238. As shown in FIG. 8 both the lamp displays 233 and the numeric displays 238 are mounted on the display subpanel board 814 which is in turn mounted on the mother panel board 780. The lamp displays may be conventional bayonet type lamps and the display subpanel board 814 contains a batch fabricated block of lamp sockets which receive the lamps. These lamp sockets provide the multiple functions of mounting, electrical connection and heat sink. Each lamp may be selectively connected to ground either directly or through a flasher bus. The lamp displays are enhanced with a special filter to suppress glare and provide an easy to read, aesthetically pleasing presentation. Displays and legends that are not illuminated are obscured behind the filter, simplifying rapid appraisal of system conditions and eliminating the need to mentally separate illuminated displays from non-illuminated but visible displays.

The numeric display elements are conventional 9 segment displays capable of displaying all numerical characters and some alphabetic characters. However, the interactive control system has sufficient data capacity to accommodate 13 segment tubes capable of displaying all numeric and alphabetic characters if desired. The eight numeric display elements of this embodiment are mounted horizontally on the display subpanel board 814.

Coupled to the lamp displays 233 are lamp drivers 710 which are coupled to the lamp display register 700. With the exception of a few lamp drivers 710 which are hardwired to respond to special functions such as over temperature, P/S error, Power on and input hold, each lamp driver responds to a selected bit of an intermediary binary digital output word stored in the lamp display register 700.

Figure 10:
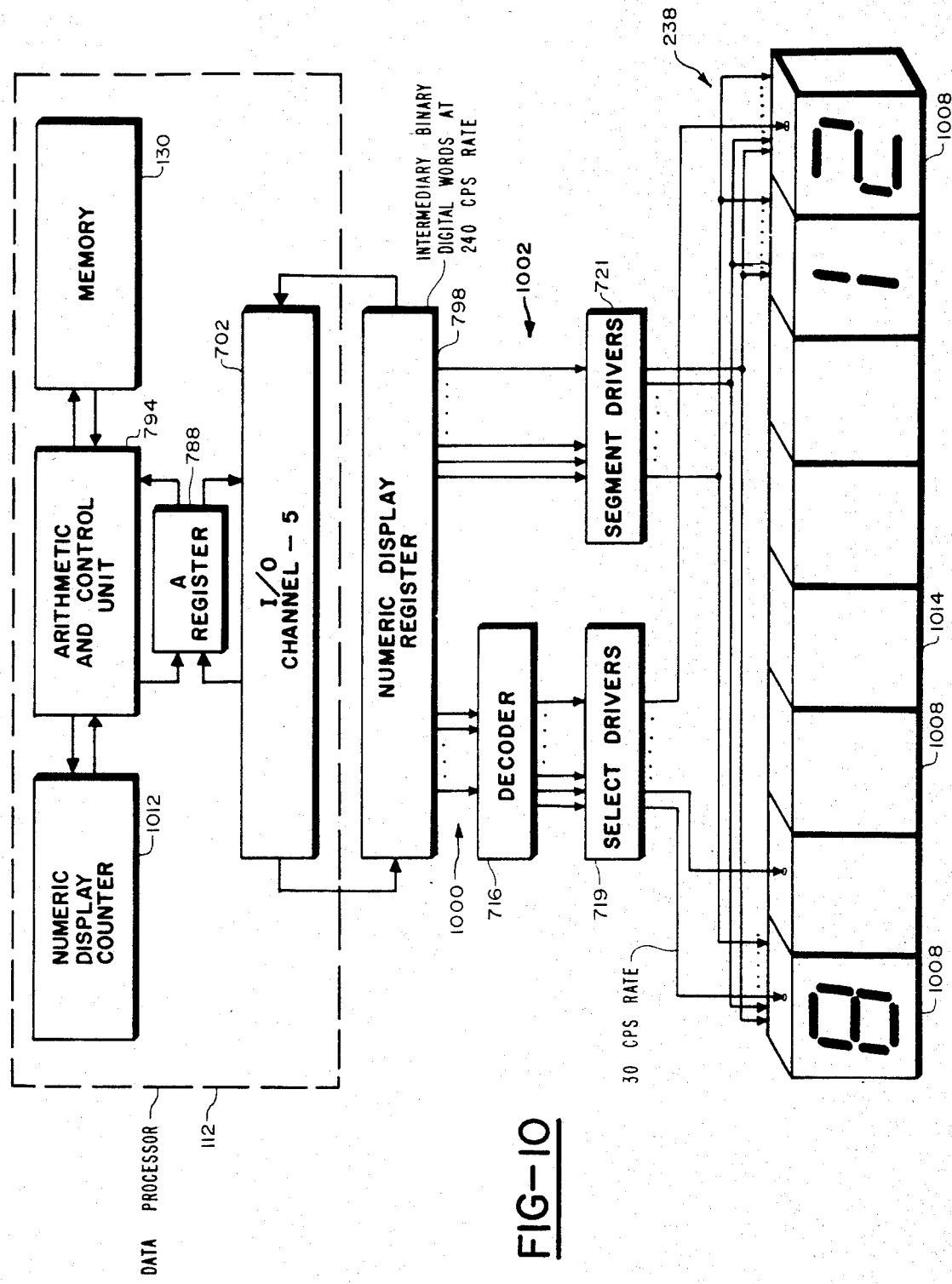
FIG. 10 is a block diagram representation of the data processing system showing further details of the relationship between the numeric display and the data processor.

As shown in greater detail in FIG. 10, the implementation of the 8 numeric display elements 238 is considerably more complex than that used for the lamp displays. Because each numeric display element 1008 requires multibit control signals a cyclic technique is used to drive all eight numeric display elements 1008 from a single numeric display register 798, thereby greatly reducing the amount of circuitry required. To accomplish this the eight numeric display elements are sequentially excited at a flicker-free 30 cps rate. In order to excite each numeric display element 1008 at a rate of 30 cps the contents of the numeric display register must change at a cyclic rate of 240 cps.

The numeric display functions are performed in the data processor 112 under program control and include the numeric display counter 1012, the update control, the refresh control, and the data registers. These functions are not physically identifiable, but are implemented under program control of the data processor.

The display parameter is converted from a binary to a BCD code, then modified for the special segment code requirements of the numeric display tube. The tube identification code is packed into the word, which is output to the numeric display register in the interactive control system.

In order to excite one of the numeric display elements 1008 the data processor 112 utilizes the count of the numeric display counter 1012 implemented under program control, for example, binary 3 indicating that the third numeric display element 1014 is to be excited, to access a location in the memory 130 storing information to excite the third numeric display with the proper character. This information is transferred from the memory 130 to a least significant portion of the A-Register 788 where it is joined by the binary count from the numeric display counter parameter (3) stored in memory in the most significant portion to form the intermediary digital output word.

This output word is transferred from the A-Register 788 through I/O Channel-5 702 to the numeric display register 798. As the word is output the numeric display counter is incremented so that the fourth numeric display element will be excited next. In addition to providing intermediary output words to the numeric display register at a rate of 240 cps, the data processor also updates the locations in the memory 130 which store the information determining the character to be displayed by each numeric display element. This updating occurs at a cyclic rate of 16 cps or twice per second for each memory location. This is about as fast as the eye of the operator can follow changes in the characters displayed by the numeric display elements 1008.

The contents of the three numeric display select bits in the most significant portion of the numeric display register 798 are communicated by three pairs of lines, each pair representing the Q and $\bar{Q}$ outputs from a flip-flop, to a decoder 716. The decoder activates one of eight select drivers 719, the third select driver in this instance. Simultaneously, nine segment drivers 721 are selectively excited according to the character information stored in the least significant portion of the word in the numeric display register 798, each driver being responsive to a different bit. In some circumstances, it may be desirable to convert the character information to a binary code, thereby reducing the number of bits required to define a character, but necessitating the use of a decoder between the numeric display register 798 and the segment drivers 721. However, such a coded technique is not used in this application.

The segment drivers 721 present drive signals forming the stored character to the appropriate segments of all eight numeric display elements 1008. However, only the third numeric display element 1014, which receives a select signal from the select drivers 719, displays the selected character.

The elemental nature of system subsystems and the related data processor coaction under program control may be utilized to simplify system setup procedures, thereby minimizing setup time as well as errors. One of the major problems that every user of sophisticated control equipment has is that of familiarizing a new operator with the complex maze of switches, lights and other controls. This is particularly important to a company which has a high turnover of personnel. Even experienced operators, on occasion will neglect to set a switch properly or overlook a procedure which could have a disastrous result.

This control panel provides a means for interactivity between the data processor and an operator. Included in this interactivity is a unique feature which permits the data processor to "lead the operator by the hand" through various operations and procedures the operator must perform for proper machine operation.

For this purpose, an operator's manual may be used in conjunction with the numeric displays on the control panel and a special program in the data processor. The operator's manual is divided into several sections, each pertaining to a particular mode of machine operation. The parameter switch would be set to a specified position defining an interactive system initialization condition. This condition would cause the data processor to sense system conditions and respond under selected program control by causing the numeric displays to display a code number identifying a section in the operator's manual. The operator would look up the number in the operator's manual to identify the machine condition or status and the next step of the procedure to place the system into its desired mode. As each procedural step is taken, a new code number appears, showing whether the last step was properly performed until the system can be started. This permits a totally inexperienced operator to sequentially perform the entire system set up or initialization.

Servo Command Structure

An apparatus and method is presented wherein a digital device precisely controls a path of a physical system such as a multi-axis analog servo for control of a machine. By providing successive integral path defining commands with an independent variable resolution finer than the resolution of the analog device with respect to that variable, the digital device is able to drive the analog device along a smooth but precisely controlled path substantially without discontinuities associated with the digital commands.

An integral command is so designated in contrast to an incremental command. An incremental command has only a single value which is usually the desired resolution value of the commands. An integral command may be a whole number command having a range of values to permit a particular parameter to be resolved with a single command. Integral number commands are exemplified with binary coded delta parameters as will be discussed hereafter. Integral number commands may include other number commands, but specifically exclude incremental commands. Integral time domain commands are exemplified hereafter with the command parameter defined by the time position of a signal.

In a servo control system in accordance with the invention, a general purpose stored program computer generates integral commands in response to predetermined desired system conditions such as temperature, pressure, position, velocity or acceleration to control a multi-axis servo system. The computer can operate open loop to command the execution of predefined commands as in a numerical control system or can operate closed loop to provide a response to parameters such as position, velocity or temperature of controlled analog devices. The analog device itself may operate open loop or may have a closed servo loop using analog or time domain feedback signals.

The use of integral commands and time domain signals intrinsic to both the digital and analog domains permits the elimination of expensive analog to digital converters, digital to analog converters and digital differential analyzers. When a time domain integral command signal is compared with a time domain feedback signal, a very precise time domain error signal is attained from which an analog control signal may be generated simply and inexpensively. As used herein a time domain signal is one in which the magnitude of information carried thereby is proportional to a time related characteristic of the time domain signal, such as the pulse width of a squarewave signal or the time between corresponding transitions of a squarewave time domain signal and a squarewave reference signal.

The use of integral commands provides substantial advantages when applied to a servo control system. Because each integral command can substantially resolve the relative slopes of the controlled axes, the commands can be presented in real time at a rate commensurate with the response rate of cutoff frequency of the controlled mechanism and substantially independent of the slopes being resolved. In contrast, presently known systems require a data rate commensurate with the resolution of the system, as for instance, one part in 10,000, which is substantially greater than the rate required for integral commands.

Stored program computers operate in "computer time", having peripheral equipment such as magnetic tape drives "slaved" to the time related requirements of the computer. In order to directly control a physical system having specific time requirements such as response time, a computer may be constrained to the time requirements of the physical system, herein referred to as real time.

A stored program digital computer in accordance with the invention provides intermediate integral commands between path end points in an iterative manner to command a precisely defined path. These integral commands may be provided directly as a time domain signal in the form of a phase referenced squarewave. Alternatively, the computer may provide digital integral commands from which the time referenced squarewave command signal is readily generated. The phase referenced squarewave command signal is compared with similar feedback signals to produce a very precise time domain error signal which may take the form of an asymmetrical squarewave. By providing the successive integral commands at a rate which exceeds the time resolution or response rate of the servos, a smoothing or filtering effect is attained wherein the servos follow the discontinuous integral commands with a smooth path closely following the intermediate command points.

A system is presented wherein a digital device controls an analog device to cause system variables to define precisely controlled paths substantially free of the discontinuities associated with the digital commands. This freedom from discontinuities will exist when the resolution of the independent variables is finer than the resolution of the system with respect to those variables. The dependent variables are system conditions which are being controlled and the independent variables are controlling system conditions. A dependent variable might be a system condition such as pressure or temperature or it might be the status of a mechanism with respect to an axis, such as position, velocity or acceleration. An independent variable might be time, a system condition or the status of a mechanism.

In accordance with the invention, a data processor operates under program control to generate integral commands precisely controlling the position of a multi-axis servo with respect to time. Each integral command completely defines the relationship of each axis with respect to the other axes and with respect to time. By generating path defining commands with a time resolution equal to or finer than the time resolution of the analog device, the discontinuous integral commands are smoothed by the integrating or filtering effect of the physical inertia and electronics of the analog device. As long as the rate at which an analog system can respond to a command is substantially equaled or exceeded by the rate at which integral commands are generated, and if the magnitude of the commands does not exceed the response capability of the system, the actual path will closely follow the integral commands and the commands will be actual path defining.

Communication between digital and analog devices is provided with time domain signals intrinsic to both the digital and analog domains. These time domain signals contain a very precise information content and can be manipulated with relatively simple equipment without loss of precision. They may also be used to easily generate signals in the analog or digital domains. As disclosed herein, integral time domain command signals may be generated directly by a computer or by a command structure in response to digital integral number commands generated by the computer. Time domain position feedback signals are generated directly by a properly excited analog resolver.

Although many different arrangements will become obvious to those skilled in the art, in the preferred embodiment of this invention a phase referenced squarewave signal is generated directly by a digital computer under program control. The phase referenced squarewave signal is a time domain signal and provides integral path defining commands to a closed loop squarewave servo.

As an alternative arrangement the data processor 112 receives a squarewave position signal, a position error signal and a velocity signal to form a closed digital loop. The computer is responsive to discrete inputs with the skip on discrete instructions to precisely measure the duration or phase of these feedback signals and process them as digital integral numbers. Because the data processor is now in a closed loop it can utilize the feedback signals to modify the integral commands and control an adaptive controller. Use of adaptive control permits precise control over the instantaneous position error of each axis by varying the gain of the power amplifier.

Independent of the advantages attained by placing the data processor in a closed loop, direct communication between the data processor and the servo in the time domain permits most components and functions of the command structure to be eliminated. By using the data processor to perform additional real time functions, the command structure may be reduced to a reference squarewave generator and a flip-flop, which serves a function similar to the flip flop $N_{30}$. All squarewaves including the reference and command squarewaves may be derived in this manner.

The data processor is responsive to the reference squarewave $\phi B$ as well as the feedback signals as discrete inputs and clocks the toggling flip-flop with discrete outputs. These discrete outputs are synchronized with the reference signal $\phi B$ and have a selected phase relationship indicating a commanded position just as position command signal.

Additionaly, the data processor may be programmed to provide a time domain error signal by toggling a flip-flop using a technique similar to that used to generate the position command signal in conjunction with flip-flops. The pulse width squarewave signal is communicated to the digital to amplitude converter which generates the servo control signal. The time domain error signal may be provided either as an override of the normal time domain error signal under appropriate circumstances or in lieu thereof with the comparator circuits being completely eliminated.

Additional circuits may be used to reduce the task of the computer in generating command signals and sensing feedback signals. For instance, a counter may be used to measure or control the time between squarewave transitions for phase or pulse width signals.

Other Considerations

Many terms well known in the numerical control art are used in this description and claims. These terms are generally defined in the prior art literature and in the numerical control industry standards. The meaning of numerical control terms is intended to be as used in this specification and, if not fully defined in this specification, then as further defined in those referenced EIA standards and, if not fully defined in those EIA Standards, then as commonly used in the numerical control field.

Well known documents on numerical control are listed below and are incorporated herein by reference.

(1) Numerical Control by Nils O. Olesten for John Wiley and Sons.

(2) Numerical Control Users Handbook by Leslie for McGraw Hill (1970).

(3) Numerical Control, Practice and Applications by William J. Patton for Reston Publishing Company (1972).

(4) Automation Bulletin No. 3B Glossary of Terms For Numerically Controlled Machines by the Electronic Industries Association (1965) New York, N.Y.

(5) Interchangeable Perforated Tape Variable Block Format for Contouring and Contouring/Positioning Numerically Controlled Machine Tools (RS-274-A) by the Electronic Industries Association (1965) New York, N.Y.

Well known documents on computer programming are listed below and are incorporated herein by reference.

(1) Programming And Coding Digital Computers by Philip M. Sherman for John Wiley & Sons Inc. (1963).

(2) Digital Computer Programming by Peter A. Stark for Mac Millian Co. (1967).

(3) Programming For Digital Computers by Joachim Jeenel for McGraw Hill (1959).

(4) IBM 360 Programming And Computing by Golden and Leichus for Prentis-Hall Inc. (1967).

(5) Fundamentals Of Flowcharting by Thomas J. Schriber for John Wiley & Sons, Inc. (1969).

(6) Programming: An introduction To Computer Languages by Ward Douglas Maurer for Holden-Day Inc. (1968).

(7) Design Of Real-Time Computer Systems by James Martin.

(8) Elements Of Computer Programming by Swallow and Price for Holt Rinehart, and Winston (1965).

The versatility of the control panel 114 and display panel 118 permits the lamp displays 233, the momentary switches 734, and the selector switches to be assigned various functions, as described below.

The momentary switches may be assigned various functions such as Optional Stop 283, Block Delete 285, EIA and ASCII Codes 287, English and Metric Units 289, CNC Source Select 280, CNC Mode 282, Mirror Image 262, Mirror Image 263, Jog 252, Emergency Stop 258, Rapid Stop or Slide Hold 260, Cycle Start 246, Cycle Stop 256, Enter 254, Clear 250, and various spares 291. These switch assignments can be changed and the execution can be defined under data processor program control.

The lamp displays may be assigned various functions such as Power On 234, Error 236, CNC 270, Execute 272, Edit 274, Delete 276, Record 278, Optional Stop 200, Block Delete 201, Spindle CW 202, Spindle CCW 203, +X Mirror Image 204, −X Mirror Image 205, +Y Mirror Image 206, −Y Mirror Image 207, EIA Code 208, ASCII Code 209, English Units 210, Metric Units 211, Slide Hold 212, Cycle On 213, Cycle Off 271, Data Hold 220, and various spares 215, 216, 217, and 219. These lamp display assignments can be changed and the execution can be defined under data processor program control.

The selector switch such as the Parameter selector switch 242, can be assigned various functions. For a Milling machine the assignments can be X Axis 227, Y Axis 226, Z Axis 225, B Axis 224, Sequence Number 223, Spindle Speed 222, I Arc Center 228, J Arc Center 229, K Arc Center 230, M Command 231, G Command 298, Feedrate 237, Feedrate Override 239, Cutter Compensation 243, and spare 221. For a lathe the assignments can be X Axis 227, Z Axis 226, Sequence Number 225, Spindle Speed 224, Turret Select 223, Tool Offsets 222, I Arc Center 228, K Arc Center 229, M Command 230, G Command 231, Feedrate 298, Feedrate Override 237, and spares 221, 239, and 243. These selector switch assignments can be changed and the execution can be defined under data processor program control.

The parts program formats for commanding numerical control systems have been standardized by the Electronic Industries Association. A typical standard is EIA Standard RS-274-B; Interchangeable Perforated Tape Variable Block Format for Contouring and Contouring/Positioning Numerically Controlled Machines; published by the Electronic Industries Association: where this standard and the references contained therein are incorporated by reference herein.

A parts program is intended to mean a program that describes a sequence of machine operations to generate a part; wherein the parts program comprises a sequential set of blocks of commands, where each block contains one or more commands for the numerical control system in a control oriented language. This language is usually comprised of a word address format as described in the previously referenced EIA Standard RS-274, but may be another such control oriented language. This control oriented language is intended to be contrasted to a compiler oriented language such as the APT language which requires a generalized input to a large scale computer but is not acceptable by a typical numerical control system.

A parts program is composed of a sequence of blocks of commands, where each block defines an operation such as a single contour and the associated commands required to implement that operation. Each block is composed of a group of words, while the words are composed of a group of characters. Each character is composed of a binary code. A parts program may be a complete program for cutting a part or may be a portion of a complete program for cutting a part. For example, a parts program stored in the parts program memory can be a portion of the operations required to generate the part, particularly if the total set of parts programs to generate the part will not fit into the storage provided. Therefore the term parts program is intended to mean a large number of blocks of commands, but not necessarily the complete set of blocks required to cut the part.

Although the preferred embodiment of this invention accepts parts programs in EIA Standard form with EIA tape codes, words, and blocks; it will be obvious to those skilled in the art from the teachings herein that other forms of numerical control commands can be provided. Greater levels of freedom in defining these numerical control commands are available with the hierarchy of computer systems described herein. Therefore; although this invention is described relative to EIA Standard parts programs, it is intended that this invention include all languages directly acceptable by a numerical control system to control the associated machine.

The term computer as used herein is intended to mean a stored program digital data processor.

When several data processors are discussed in the description and in the claims; the term data processor or numerical control data processor is intended to mean the data processor 112 in the numerical control system 110, while the term remote data processor is intended to mean a data processor that is not included in the numerical control system 110 but communicates with the system 110 over a data link 150 through the auxiliary I/O channels 128.

It is thus clearly seen that the present invention provides a novel means and method of providing a CNC system for controlling machines.

From the above description it will be apparent that there is thus provided a device of the character described possessing the particular features of advantage before enumerated as desirable, but which obviously is susceptible to modification in its form, proportions, detail construction and arrangement of parts without departing from the principle involved or sacrificing any of its advantages.

While in order to comply with the statute, the invention has been described in language more or less specific as to structural features, it is to be understood that the invention is not limited to the specific features shown, but that the means and construction herein disclosed comprise the preferred form of several modes of putting the invention into effect, and the invention is, therefore, claimed in any of its forms or modifications within the legitimate and valid scope of the appended claims.

What is claimed is:

1. A computerized machine control system comprising:
   an output date link for communicating machine information to a remote computer in response to a data link output signal;
   an input data link for inputting machine command information from a remote computer source of machine command information;
   a machine command memory for storing machine command information;
   an operator control panel for generating machine command information in response to operator action;
   select means for providing a plurality of machine command source select signals;
   a stored program computer for processing machine command information in response to a stored computer program; said computer including means for receiving machine command information from said input data link in response to a first source select signal, means for receiving machine command information from said machine command memory in response to a second source select signal, means for receiving machine command information from said operator control panel in response to a third source select signal, means for storing the computer program, means for processing the machine command information received in response to a source select signal under control of the stored computer program, means for generating the data link output signal to said output data link in response to said processing of the machine command information with said processing means to communicate the machine information to said remote computer, means for generating a machine related display signal in response to the processing of the machine command information with said processing means, and means for generating a machine control signal in response to said processing of the machine command information with said processing means;
   a display for displaying machine-related information to an operator in response to the display output signal; and
   a controller for controlling a machine in response to the machine control signal.

2. The system as set forth in claim 1 above, wherein said computer is a integrated circuit computer, wherein said computer program storing means is an integrated circuit read only memory for storing the computer program in read only form, wherein said computer further includes an integrated circuit alterable memory for storing processed information, and wherein said processing means includes means for generating information stored in said alterable memory in response to the processing of the received machine command information.

3. The system as set forth in claim 1 above, wherein said machine control system is arranged for controlling a machine tool, wherein said controller is arranged for controlling said machine tool in response to the machine control signal, wherein the machine command information from said input data link includes parts program command in EIA format for controlling said machine tool, and wherein the machine control signal is generated in response to the processing of the parts program information with said processing means.

4. The system as set forth in claim 1 above, further comprising a punched tape reader for generating parts program information in EIA form in response to reading of a punched tape, wherein said computer further includes means for receiving parts program information from said punched tape reader in response to a third source select signal, and wherein said input data link includes a telephone data link for inputting the machine command information as parts program information in ASCII form.

5. The system as set forth in claim 1 above, wherein said machine controller includes a closed loop servo for controlling a machine in response to the machine control signal.

6. The system as set forth in claim 1 above, further comprising a CRT display for displaying parts program information in response to a display signal, said computer further including display output means for generating the display signal in response to the processing of machine command information with said processing means.

7. The system as set forth in claim 1 above, further comprising a printer for printing information in response to a print control signal, said computer further including printer output means for generating the print control signal in response to the processing of machine command information with said processing means.

8. A computerized machine control system comprising:
- a data link for communicating machine command information from a remote computer source of machine command information;
- an operator panel for generating machine command information;
- an integrated circuit stored program computer for generating machine control signals in response to processing of machine command information under control of a stored computer program, said computer including
  - (a) an integrated circuit read only memory for storing a computer program in read only form,
  - (b) an integrated circuit alterable memory for storing processed information,
  - (c) input means for storing machine command information communicated with said data link and machine command information generated with said operator panel in said alterable memory,
  - (d) processing means for processing the machine command information stored in said alterable memory in response to the computer program stored in said read only memory,
  - (e) output control means for generating the machine control signals in response to the processing of machine command information with said processing means, and
  - (f) output data link means for generating an output data link signal in response to the processing of machine command information with said processing means;
- a machine for performing machine operations in response to the machine control signal from said output means; and
- a data link for communicating information to a remote computer in response to the output data link signal from said output data link means.

9. A computerized machine control system comprising:
- a data link for communciating machine command information from a remote computer source of machine command information;
- an operator panel for generating machine command information;
- select means for generating a select signal to select a source of machine command information;
- a stored program computer for generating machine control signals in response to processing of machine command information under control of a stored computer program, said computer including
  - (a) a memory for storing a computer program,
  - (b) input means for inputting machine command information communicated with said data link and machine command information generated with said operator panel,
  - (c) means for selecting machine command information from said operator panel and from said data link,
  - (d) processing means for processing the machine command information selected with said select means under control of the computer program stored in said memory in response to the select signal,
  - (e) output control means for generating the machine control signals in response to the processing of machine command information with said processing means, and
  - (f) output data link means for generating an output data link signal in response to the processing of machine command information with said processing means;
- a machine for performing machine operations in response to the machine control signal from said output means; and
- a data link for communicating information to a remote computer in response to the output data link signal from said output data link means.

10. A computerized machine control system comprising:
- a data link for communicating machine command information from a remote computer source of machine command information;
- an operator panel for generating machine command information;
- a stored program computer for generating machine control signals in response to processing of machine command information under control of a stored computer program, said computer including
  - (a) a memory for storing a computer program,
  - (b) input means for inputting machine command information communicated with said data link and machine command information generated with said operator panel,
  - (c) processing means for processing the machine command information input with said input means under control of the computer program stored in said memory,
  - (d) output control means for generating the machine control signals in response to the processing of machine command information with said processing means, and
  - (e) output data link means for generating an output data link signal in response to the processing of machine command information with said processing means;
- a machine for performing machine operations in response to the machine control signal from said output means; and
- a data link for communicating information to a remote computer in response to the output data link signal from said output data link means.

11. The system as set forth in claim 10 above, wherein said machine control system is arranged for controlling a machine tool, wherein the machine command information from said operator panel and said data link is parts program comands in EIA format for controlling a machine tool, and wherein the machine control signal is generated in response to the processing of the parts program commands.

12. The system as set forth in claim 10 above, further comprising a punched tape reader for generating parts program information in EIA form in response to reading of a punched tape and wherein said data link includes a telephone data link for generating parts program information in ASCII form.

13. The system as set forth in claim 10 above, wherein said operator panel includes means for generating parts program information in response to operator action, wherein said computer processing means includes means for processing the parts program information from said operator panel under control of the program from said memory, and wherein said computer output control means includes means for generating the machine control signal in response to the processing of parts program information from said operator panel with said processing means.

14. The system as set forth in claim 10 above, further comprising means for storing the machine command information input from said operator panel and from said data link with said input means, wherein said processing means includes means for processing the machine command information stored in said machine command information storing means under control of the program stored in said computer memory, wherein said computer output control means includes means for generating the machine control signals in response to the processing of the machine command information stored in said machine command information storing means.

15. A computerized machine control system comprising:
  a data link for communicating machine command information from a remote computer source of machine command information;
  an operator panel for generating machine command information;
  a CRT for displaying machine-related information in response to a display signal;
  a stored program computer for generating machine control signals in response to processing of machine command information under control of a stored computer program, said computer including
  (a) a memory for storing a computer program,
  (b) input means for inputting machine command information communicated with said data link and machine command information generated with said operator panel,
  (c) processing means for processing the machine command information input with said input means under control of the computer program stored in said memory,
  (d) display output means for generating the display signal to said CRT in response to the processing of machine command information with said processing means,
  (e) output control means for generating the machine control signals in response to the processing of machine command information with said processing means, and
  (f) output data link means for generating an output data link signal in response to the processing of machine command information with said processing means;
  a machine for performing machine operations in response to the machine control signal from said output means; and
  a data link for communicating information to a remote computer in response to the output data link signal from said output data link means.

16. A computerized machine control system comprising:
  a data link for communicating machine command information from a remote computer source of machine command information;
  an operatorpanel for generating machine command information;
  a printer for printing machine-related information in response to a print control signal;
  a stored program computer for generating machine control signals in response to processing of machine command information under control of a stored computer program, said computer including
  (a) a memory for storing a computer program,
  (b) input means for inputting machine command information communicated with said data link and machine command information generated with said operator panel,
  (c) processing means for processing the machine command information input with said input means under control of the computer program stored in said memory,
  (d) printer output means for generating the print control signal to said printer in response to the processing of machine command information with said processing means,
  (e) output control means for generating the machine control signals in response to the processing of machine command information with said processing means, and
  (f) output data link means for generating an output data link signaling response to the processing of machine command information with said processing means;
  a machine for performing machine operations in response to the machine control signal from said output means; and
  a data link for communicating information to a remote computer in response to the output data link signal from said output data link means.

17. A computerized machine control system comprising:
  a data link for communicating machine command information from a remote computer source of machine command information;
  an operator panel for generating machine command information;
  a machine command memory for storing machine command information;
  a stored program computer for generating machine control signals in response to processing of machine command information under control of a stored computer program, said computer including
  (a) a program memory for storing a computer program,
  (b) input means for inputting machine command information communicated with said data link and machine command information generated with said operator panel,
  (c) means for storing the communicated machine command information from said data link in said machine command memory,
  (d) means for accessing machine command information from said machine command memory,
  (e) processing means for processing the machine command information accessed from said machine command memory under control of the computer program stored in said program memory, (f) output control means for generating the machine control signals in response to the processing of machine command information with said processing means, and (g) output data link means for generating an output data link signal in response to the processing of machine command information with said processing means;

a machine for performing machine operations in response to the machine control signal from said output means; and a data link for communicating information to a remote computer in response to the output data link signal from said output data link means.

18. The system as set forth in claim 17 above further comprising modify means for providing modify signals in a control-oriented language in response to operator action, said computer further including means for modifying the parts program information stored in said parts program memory in response to at least one of the modify signals.

19. A machine control system comprising:

a machine feedback device for generating a machine feedback signal in response to a machine operation;

a data link from a remote computer for generating a machine command signal;

a stored program digital computer for generating a machine control signal in response to processing of a machine command signal under control of a stored program, said computer including (a) a computer memory for storing the program, (b) feedback input logic for generating an input feedback signal in response to the machine feedback signal from said machine feedback device, (c) command input logic for generating an input command signal in response to the machine command signal from said data link, (d) processing logic for processing the input feedback signal from said feedback input logic in response to the input command signal from said data link input logic under control of the program stored in said computer memory, (e) output data link logic for generating an output data link signal in response to the machine feedback signal from said feedback input logic, and (f) output control logic for generating the machine control signal in response to the processing of the input feedback signal with said processing logic;

a data link to a remote computer for communicating machine-related information to said remote computer in response to the output data link signal from said output data link logic;

a controller for controlling a machine in response to the machine control signal from said output control logic; and a machine for operating under control of said controller.

20. The system as set forth in claim 19 above, wherein said computer memory is an integrated circuit read only memory for storing the program in read only form, wherein said computer further includes an integrated circuit alterable memory for storing processed information, and wherein said processing logic includes means for generating the processed information stored in said alterable memory in response to the processing of the input feedback signal with said processing logic under control of the program stored in said computer memory.

21. The system as set forth in claim 19 above, wherein said machine control system is arranged for controlling a machine tool, wherein said machine is a machine tool, wherein said controller includes means for controlling said machine tool in response to the machine control signal from said output control logic, wherein the machine command signals from said data link include parts program command signals in EIA format for controlling said machine tool, and wherein the processing of the input feedback signal is performed in response to the parts program command signals in EIA format.

22. The system as set forth in claim 19 above, further comprising a tape reader for generating a machine command signal in response to reading of a tape and select means for generating a select signal to select a source of machine command signals, wherein said command input logic includes means for generating the input command signal in response to selection of a machine command signal from said tape reader and from said data link.

23. The system as set forth in claim 22 above, wherein said tape reader includes a punched tape reader for generating a machine command signal in EIA signal form in response to reading of a punched tape and wherein said data link includes a telephone data link for generating a machine command signal in ASCII signal form.

24. The system as set forth in claim 19 above, wherein said machine controller includes a closed loop servo for controlling said machine in response to the machine control signal.

25. The system as set forth in claim 19 above, further comprising an operator control panel for generating a machine command signal in response to operator action, wherein said computer further includes panel input logic for receiving the machine command signal from said operator control panel; wherein said processing logic further includes means for processing the maching command signal from said operator control panel under control of the program stored in said computer memory, and wherein said output control logic includes means for generating the machine control signal in response to the processing of a machine command signal from said operator panel.

26. The system as set forth in claim 19 above, further comprising a printer for printing information in response to a print control signal, said computer further including printer output means for generating the print control signal in response to the processing of the input feedback signal with said processing logic.

27. A machine control system comprising:

a machine feedback device for generating a machine feedback signal in response to a machine operation;

a data link from a remote computer for generating a machine command signal;

a stored program digital computer for generating a machine control signal in response to processing of a machine command signal under control of a stored program, said computer including (a) a computer memory for storing the program, (b) feedback input logic for generating an input feedback signal in response to the machine feedback signal from said machine feedback device, (c) command input logic for generating an input command signal in response to the machine command signal from said data link, (d) means for storing input command signal from said command input logic, (e) processin logic for processing the input feedback signal from said feedback input logic in response to the input command signals stored in said machine command signal storing means under control of the program stored in said computer memory, (e) output data link logic for generating an output data link signal in response to the machine feedback signal from said feedback input logic, and (f) output control logic for generating the machine control signal in response to the stored input command signal responsive processing of the input feedback signal with said processing logic;

a data link to a remote computer for communicating machine-related information to said remote computer in response to the output data link signal from said output data link logic;

a controller for controlling a machine in response to the machine control signal from said output control logic; and a machine for operating under control of said controller.

28. A machine control system comprising:

a machine feedback device for generating a machine feedback signal in response to a machine operation;

a data link from a remote computer for generating a machine command signal;

a stored program digital computer for generating a machine control signal in response to processing of a machine command signal under control of a stored program, said computer including (a) a computer memory for storing the program, (b) feedback input logic for generating an input feedback signal in response to the machine feedback signal from said machine feedback device, (c) command input logic for generating an input command signal in response to the machine command signal from said data link, (d) processing logic for processing the input feedback signal from said feedback input logic in response to the input command signal from said data link input logic under control of the program stored in said computer memory, (e) output data link logic for generating an output data link signal in response to the machine feedback signal from said feedback input logic, (f) output control logic for generating the machine control signal in response to the processing of the input feedback signal with said processing logic, an (g) display output means for generating a display signal in response to the processing of the input feedback signal with said processing logic;

a data link to a remote computer for communicating machine-related information to said remote computer in response to the output data link signal from said output data link logic;

a CRT display for displaying machine command information in response to the display signal;

a controller for controlling a machine in response to the machine control signal from said output control logic; and a machine for operating under control of said controller.

29. A machine control system comprising:

an input data link from a remote computer for communicating machine commands from said remote computer;

an operator panel for generating machine commands in response to operator action;

a stored program digital computer for generating a machine control signal in response to processing of machine commands under control of a stored program, said computer including (a) a program memory for storing the program, (b) processing logic for processing the machine commands from said operator panel and for processing machine commands from said input data link under control of the stored program from said program memory, (c) output control logic for generating the machine control signal in response to the processing of the machine commands with said processing logic, and (d) output data link logic for generating an output data link signal in response to the processing of the machine commands with said processing logic;

a machine controller for controlling a machine in response to the machine control signal from said computer output logic; and an output data link to a remote computer for communicating machine information to said remote computer in response to the output data link signal from said output data link logic.

30. A machine control system comprising:

means for communicating information to a remote computer system in response to a communication output signal from a computer;

a machine command memory for storing machine commands;

an operator panel for generating machine commands;

a stored program computer for generating machine control signals in response to processing of machine commands under control of a stored computer program, said computer including (a) a computer program memory for storing a computer program, (b) input logic for inputting machine commands stored in said machine command memory and machine commands generated with said operator panel, (c) processing logic for processing the machine commands input with said input logic under control of the stored computer program, (d) output control logic for generating a machine control signal in response to the processing of the machine commands with said processing logic, and (e) output communication logic for generating the communication output signal to said communicating means in response to the processing of the machine commands with said processing logic; and a controller for controlling a machine in response to the machine control signals from said output logic.

31. The system as set forth in claim 30 above, wherein said computer is an integrated circuit computer and wherein said computer program includes an integrated circuit read only memory for storing the computer program.

32. A machine control system including a machine control unit for controlling a machine and a machine for generating a part, said machine control unit comprising:
- means for inputting parts program commands, wherein said inputting means includes
  - (a) a tape reader for generating parts program commands in response to a punched tape and
  - (b) a data link for generating parts program commands in response to communication with a remote computer system;
- means for storing digital information, said storing means including a parts program memory for storing a plurality of blocks of parts program commands and a computer stored program memory for storing a plurality of computer instructions;
- computer means for processing parts program information in response to a plurality of computer instructions stored in said storing means, said computer means including
  - (a) means for receiving parts program command from said tape reader,
  - (b) means for storing the received parts program commands from said tape reader in said parts program memory,
  - (c) means for receiving parts program commands from said data link,
  - (d) means for storing the received parts program commands from said data link in said parts program memory,
  - (e) means for processing the parts program commands stored in said parts program memory in response to the computer instructions stored in said computer stored program memory, and
  - (f) means for generating machine command signals in response to the processing of parts program commands with said processing means; and
- control means for controlling a machine in response to the machine command signals.

33. A system for controlling a machine, said system comprising:
- a remote computer for generating machine commands;
- a data link for communicating the machine commands from said remote computer to a machine control unit; and
- a machine control unit for controlling a machine in response to machine commands, said machine control unit including
  - (1) an operator panel for generating machine commands,
  - (2) feedback means for generating a machine feedback signal related to a machine operation,
  - (3) a stored program computer for generating machine control signals in response to processing of machine commands, said stored program computer including
    - (a) means for receiving the machine commands from said data link and from said operator panel,
    - (b) means for receiving the machine feedback signal from said feedback means,
    - (c) a memory for storing a computer program,
    - (d) processing logic for processing the machine feedback signal received with said machine feedback signal receiving means in response to the machine commands received with said machine command receiving means to generate machine control signals under control of the program stored in said memory, and
    - (e) output logic for outputting the machine control signals generated with said processing logic, and
  - (4) means for controlling a machine in response to the machine control signals from said output means.

* * * * *